US010283052B2

(12) United States Patent
Ota

(10) Patent No.: US 10,283,052 B2
(45) Date of Patent: May 7, 2019

(54) ELECTRO-OPTICAL DEVICE AND ELECTRONIC APPARATUS

(71) Applicant: SEIKO EPSON CORPORATION, Tokyo (JP)

(72) Inventor: Hitoshi Ota, Shiojiri (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 15/909,226

(22) Filed: Mar. 1, 2018

(65) Prior Publication Data
US 2018/0261161 A1 Sep. 13, 2018

(30) Foreign Application Priority Data

Mar. 10, 2017 (JP) .................. 2017-045993

(51) Int. Cl.
G09G 3/3258 (2016.01)
H01L 27/32 (2006.01)
H01L 51/52 (2006.01)
G09G 3/3233 (2016.01)

(52) U.S. Cl.
CPC ......... *G09G 3/3258* (2013.01); *G09G 3/3233* (2013.01); *H01L 27/3276* (2013.01); *H01L 51/5206* (2013.01); *H01L 51/5221* (2013.01); *G09G 2310/0264* (2013.01); *G09G 2330/00* (2013.01)

(58) Field of Classification Search
CPC ......... G09G 3/3233; G09G 2320/0233; G09G 2320/045; G09G 3/3258
See application file for complete search history.

(56) References Cited

U.S. PATENT DOCUMENTS

| 2010/0194716 A1* | 8/2010 | Park ..................... G09G 3/3233 345/204 |
| 2010/0253666 A1 | 10/2010 | Yamamoto |
| 2010/0289788 A1 | 11/2010 | Yoshizaki et al. |
| 2011/0122119 A1* | 5/2011 | Bae ..................... G09G 3/3233 345/211 |
| 2013/0093737 A1 | 4/2013 | Ota et al. |

(Continued)

FOREIGN PATENT DOCUMENTS

| JP | 2010-243560 A | 10/2010 |
| JP | 2010-266715 A | 11/2010 |

(Continued)

*Primary Examiner* — Gerald Johnson
(74) *Attorney, Agent, or Firm* — Oliff PLC

(57) ABSTRACT

An electro-optical device includes: a pixel circuit that includes a first transistor and an electro-optical element to which a current is supplied from the first transistor, the pixel circuit being driven in a frame period composed of a display period and a blanking period; a driving circuit that controls the pixel circuit such that the pixel circuit executes a compensation operation that compensates the property of the first transistor in the display period and such that the pixel circuit does not execute the compensation operation in the blanking period; and a dummy circuit that consumes electric power in the blanking period such that the total power consumption in the pixel circuit and the dummy circuit in the display period and the total power consumption in the pixel circuit and the dummy circuit in the blanking period approach each other.

14 Claims, 17 Drawing Sheets

(56) References Cited

U.S. PATENT DOCUMENTS

| | | | | |
|---|---|---|---|---|
| 2014/0347401 A1* | 11/2014 | Hwang | ............... | G09G 3/3233 345/690 |
| 2014/0361960 A1* | 12/2014 | Yamauchi | ............ | G09G 3/3233 345/76 |
| 2015/0022513 A1* | 1/2015 | Kim | ................. | G09G 3/3225 345/212 |
| 2015/0130787 A1* | 5/2015 | Chung | ............... | G09G 3/3225 345/214 |
| 2016/0042692 A1 | 2/2016 | Ota et al. | | |
| 2017/0061877 A1* | 3/2017 | Lee | .................. | G09G 3/3233 |
| 2018/0061362 A1* | 3/2018 | Kim | ................... | G09G 5/003 |

FOREIGN PATENT DOCUMENTS

| | | |
|---|---|---|
| JP | 2013-088611 A | 5/2013 |
| JP | 2016-009135 A | 1/2016 |
| JP | 2016-038425 A | 3/2016 |

\* cited by examiner

ELECTRO-OPTICAL DEVICE AND ELECTRONIC APPARATUS

BACKGROUND

1. Technical Field

The present invention relates to an electro-optical device and an electronic apparatus including the electro-optical device.

2. Related Art

Various electro-optical devices recently proposed use an electro-optical element such as an organic light emitting diode (OLED). This type of electro-optical device is formed by providing pixel circuits, each of which includes an electro-optical element and a driving transistor, in correspondence to intersections between scanning lines and data transfer lines. Each pixel circuit corresponds to a pixel of an image to be displayed. The gradation (typically, brightness) of the electro-optical element included in the pixel circuit changes depending on a current (driving current) supplied to the electro-optical element. The driving transistor included in the pixel circuit controls this driving current.

If the transistor property (for example, a threshold voltage Vth) of the driving transistor in each pixel circuit included in the electro-optical device is not uniform, the gradation displayed by the electro-optical element varies, causing the problem of unevenness in display. However, it is difficult for the driving transistors in all pixel circuits included in the electro-optical device to have an identical transistor property. In view of this, various technologies have been proposed that compensate variations in the transistor properties of the driving transistors in all pixel circuits included in an electro-optical device. An example of these technologies is disclosed in JP-A-2010-243560. With the technology disclosed in JP-A-2010-243560, when a setting is made to cause an electro-optical element included in a pixel circuit to emit light, a compensation operation to compensate the property of the driving transistor is executed.

If one frame period required to display one image is divided into a display period and a blanking period, when the technology disclosed in JP-A-2010-243560 is used, a compensation operation is performed in the display period and is not displayed in the blanking period. Accordingly, a load applied to the power supply varies depending on whether the period is the display period or blanking period. When the load on the power supply varies, the power supply voltage also varies and thereby display quality may be deteriorated as caused by, for example, flicker.

SUMMARY

An advantage of some aspects of the invention is to provide a technology that makes it possible to avoid a variation in the power supply voltage in the blanking period and to avoid display quality deterioration caused by a variation in the transistor property of a driving transistor included in a pixel circuit.

An electro-optical device according to a first aspect of the invention includes: a pixel circuit that includes a first transistor and an electro-optical element to which a current is supplied from the first transistor, the pixel circuit being driven in a frame period composed of a display period and a blanking period; a driving circuit that controls the pixel circuit such that the pixel circuit executes a compensation operation that compensates the property of the first transistor in the display period and such that the pixel circuit does not execute the compensation operation in the blanking period; and a dummy circuit that consumes electric power in the blanking period such that the total power consumption in the pixel circuit and the dummy circuit in the display period and the total power consumption in the pixel circuit and the dummy circuit in the blanking period approach each other.

According to this aspect, in the display period, the compensation operation that compensates the property of the first transistor (driving transistor) is executed, so it is possible to avoid deterioration in display quality caused by a variation in the transistor property of the first transistor. Although, in the blanking period, the pixel circuit is controlled such that it does not execute the compensation operation, the dummy circuit consumes electric power in the blanking period such that the total power consumption in the pixel circuit and the dummy circuit in the display period and the total power consumption in the pixel circuit and the dummy circuit in the blanking period approach each other. As a result, it is possible to reduce variations in a power supply voltage caused by variations in the load on the power supply and to improve unevenness in display.

In the electro-optical device, the dummy circuit is preferably equivalent to the pixel circuit in the compensation operation. The driving circuit preferably controls the dummy circuit such that the dummy circuit performs an operation equivalent to the compensation operation in the blanking period.

The dummy circuit is equivalent to the pixel circuit when components constituting the dummy circuit match components constituting the pixel circuit and when, although components constituting the dummy circuit do not match components constituting the pixel circuit, the electrical functions of the dummy circuit are similar to the electrical functions of the pixel circuit. For example, the dummy circuit may be a circuit that can execute an operation that simulates the compensation operation executed by the pixel circuit.

In the electro-optical device, each of the pixel circuit and dummy circuit preferably includes: the first transistor; a second transistor, one of the source and drain of the second transistor being connected to a data transfer line, the other of the source and drain of the second transistor being connected to the gate of the first transistor; and a third transistor, one of the source and drain of the third transistor being connected to the data transfer line, the other of the source and drain of the third transistor being connected to the drain of the first transistor. The driving circuit preferably performs control such that when the driving circuit causes the pixel circuit to perform the compensation operation in the display period and when the driving circuit causes the dummy circuit to perform the compensation operation in the blanking period, the second transistor and third transistor in the pixel circuit and the second transistor and third transistor in the dummy circuit are turned on.

In the electro-optical device, each of the pixel circuit and dummy circuit preferably includes: the first transistor; a second transistor, one of the source and drain of the second transistor being connected to a data transfer line, the other of the source and drain of the second transistor being connected to the gate of the first transistor; and a third transistor, one of the source and drain of the third transistor being connected to the data transfer line, the other of the source and drain of the third transistor being connected to the drain of the first transistor. The driving circuit preferably performs control such that when the driving circuit causes the pixel circuit to perform the compensation operation in the display period, the second transistor and third transistor in the pixel circuit are turned on, and when the driving circuit causes the dummy circuit to perform the compensation operation in the blanking period, the second transistor and third transistor in the dummy circuit are turned on.

In this case, the pixel circuit and dummy circuit are identical in that they include at least the first transistor and second transistor. Since the first transistor and second transistor are controlled similarly both in the compensation operation executed by the pixel circuit in the display period and in the compensation operation executed by the dummy circuit in the blanking period, the total power consumption in the pixel circuit and dummy circuit in the display period and the total power consumption in the pixel circuit and dummy circuit in the blanking period can be made to approach each other.

In the electro-optical device, each of the pixel circuit and dummy circuit preferably includes: a fourth transistor, the source of the fourth transistor being connected to the drain of the first transistor, the drain of the fourth transistor being connected to the electro-optical element; and a fifth transistor, one of the source and drain of the fifth transistor being connected to a potential line, the other of the source and drain of the fifth transistor being connected to the drain of the fourth transistor. A potential that turns off the fourth transistor is preferably supplied to the gate of the fourth transistor in the dummy circuit, and a potential that turns on the fifth transistor is preferably supplied to the gate of the fifth transistor in the dummy circuit.

In this case, although the dummy circuit includes the fourth transistor and fifth transistor as in the pixel circuit, the fourth transistor in the dummy circuit is turned off both in the display period and in the blanking period. In the dummy circuit, therefore, a current does not flow from the first transistor into the electro-optical element, so it is possible to avoid the emission of light by the electro-optical element in the dummy circuit.

In the electro-optical device, the dummy circuit preferably includes: a sixth transistor, the drain of the sixth transistor being connected to a power supply line through which a power supply potential is supplied to the first transistor in the pixel circuit, the drain and gate of the sixth transistor being connected together; and a seventh transistor, one of the source and drain of the seventh transistor being connected to a data transfer line, the other of the source and drain of the seventh transistor being connected to the gate of the sixth transistor. The driving circuit preferably performs control such that the seventh transistor in the dummy circuit is turned on in the blanking period.

In this case, the sixth transistor in the dummy circuit is connected to a diode. Since the seventh transistor is turned on in the blanking period, a current flows from the sixth transistor through the seventh transistor into the data transfer line. Thus, electric power is consumed.

In the electro-optical device in which the dummy circuit is equivalent to the pixel circuit in the compensation operation and the driving circuit controls the dummy circuit such that the dummy circuit performs an operation equivalent to the compensation operation in the blanking period, the dummy circuit preferably includes an eighth transistor, a ninth transistor, and a resistor, which are connected in series between a first power supply line that supplies a first power supply potential and a second power supply line that supplies a second power supply potential. The gate of the eighth transistor is preferably given a potential that turns on the eighth transistor; the driving circuit preferably performs control such that the ninth transistor in the dummy circuit is turned on in the blanking period.

The eighth transistor, ninth transistor, and resistor, which are connected in series, are only needed to be connected in series. These three elements may be connected in any sequence.

An electro-optical device according to a second aspect of the invention includes a pixel matrix section including a first and second pixel circuits each of which includes a first transistor and an electro-optical element to which a current is supplied from the first transistor, and each of which is driven in a frame period composed of a display period and a blanking period. The electro-optical device also includes a driving circuit that controls the first pixel circuit such that the first pixel circuit executes a compensation operation that compensates the property of the first transistor in the display period and such that the first pixel circuit does not execute the compensation operation in the blanking period, and that controls the second pixel circuit such that the second pixel circuit executes an operation equivalent to the compensation operation such that the total power consumption in the pixel matrix section in the display period and the total power consumption in the pixel matrix section in the blanking period approach each other.

An electronic apparatus according to a third aspect of the invention includes the electro-optical device in any one of the above aspects.

BRIEF DESCRIPTION OF THE DRAWINGS

The invention will be described with reference to the accompanying drawings, wherein like numbers reference like elements.

DESCRIPTION OF EXEMPLARY EMBODIMENTS

Embodiments of the invention will be described with reference to the drawings.

First Embodiment

Figure 1:
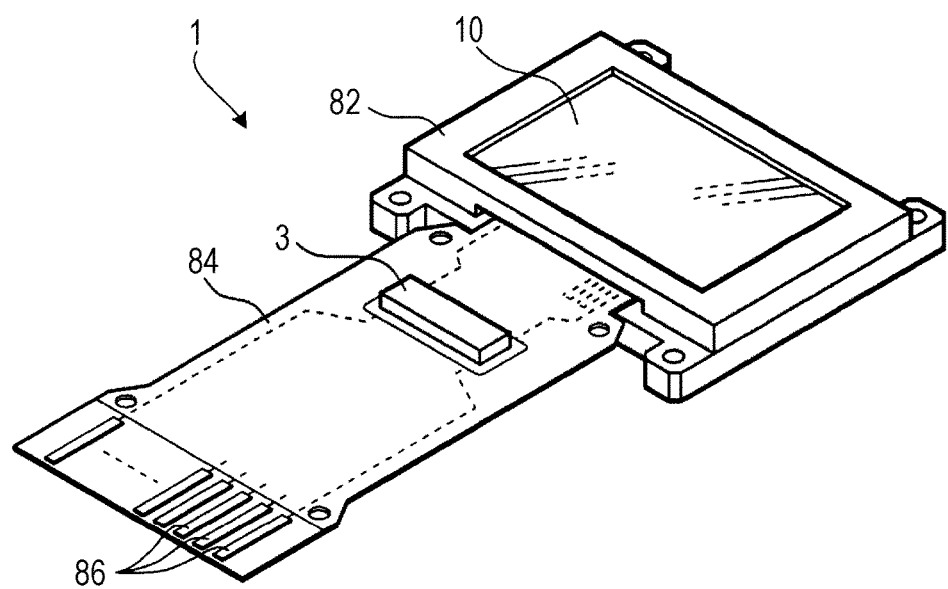
FIG. 1 is a perspective view illustrating the structure of an electro-optical device according to a first embodiment of the invention.

FIG. 1 is a perspective view illustrating the structure of an electro-optical device 1 according to a first embodiment of the invention. The electro-optical device 1 is, for example, a microdevice that displays an image on, for example, a head-mounted display.

As illustrated in FIG. 1, the electro-optical device 1 includes a display panel 10 and a control circuit 3 that controls the operation of the display panel 10. The display panel 10 includes a plurality of pixel circuits and a driving circuit that drives the pixel circuits. In this embodiment, the plurality of pixel circuits and the driving circuit included in the display panel 10 are formed on a silicon circuit board, and an OLED, which is an example of an electro-optical element, is used in the pixel circuit. The display panel 10 is accommodated in, for example, a case 82, shaped like a frame, that has an opening in a display section. One end of a flexible printed circuits (FPC) board 84 is connected to the display panel 10. The control circuit 3 formed as a semiconductor chip is mounted on the FPC board 84 by chip-on-film (COF) technology. The FPC board 84 has a plurality of terminals 86, through which the FPC board 84 is connected to a high-end circuit (not illustrated).

Figure 2:
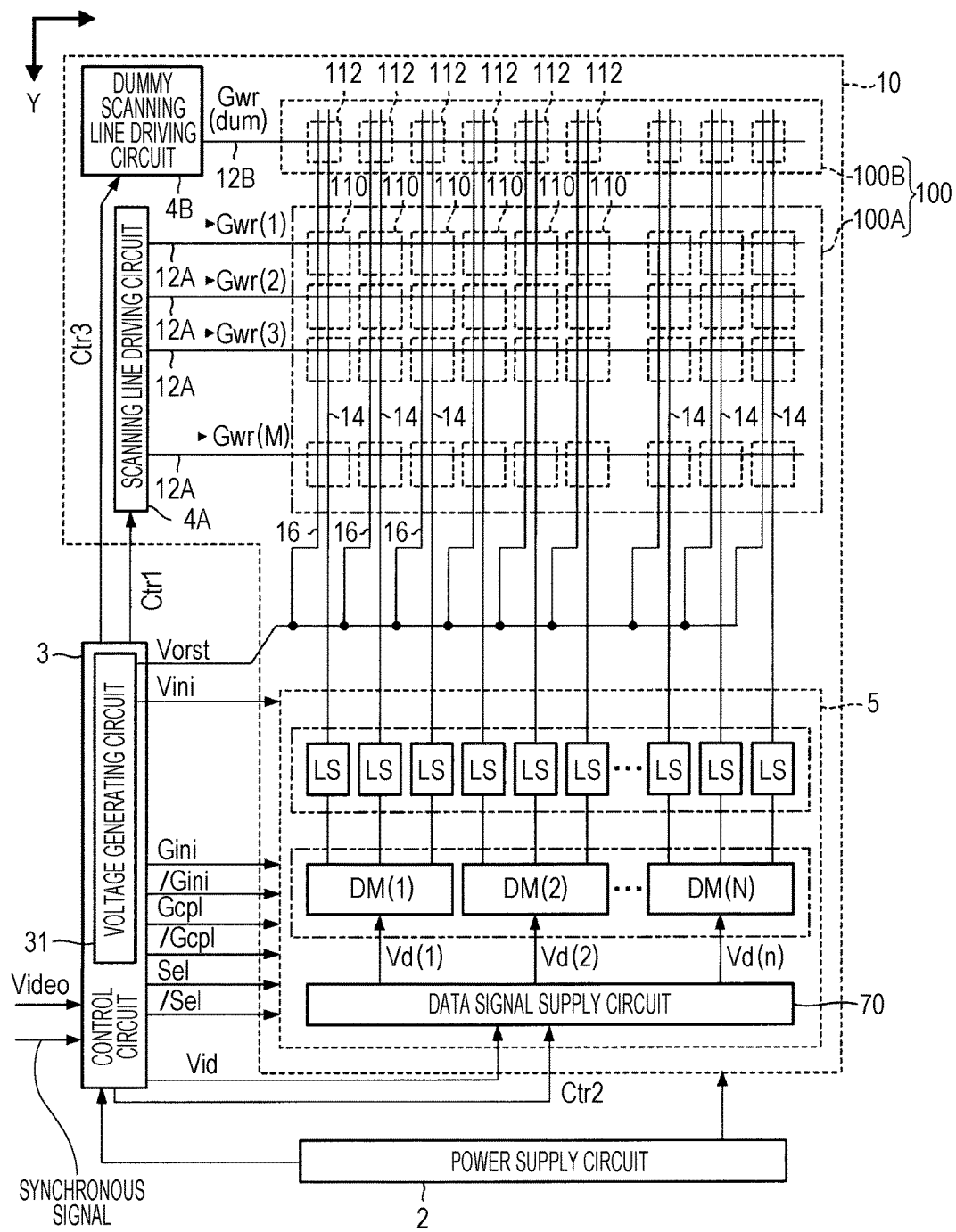
FIG. 2 is a block diagram illustrating the structure of the electro-optical device.

FIG. 2 is a block diagram illustrating the structure of the electro-optical device 1 according to the embodiment. In addition to the display panel 10 and control circuit 3 described above, the electro-optical device 1 includes a power supply circuit 2 that supplies electric power for use in operation to the control circuit 3 and display panel 10. The control circuit 3 is given an image data Video in digital form from a high-end circuit (not illustrated) in synchronization with a synchronizing signal. The image data Video is, for example, data that uses eight bits to stipulate the gray-scale level of a pixel of an image to be displayed on the display panel 10 (strictly, on a display section 100, which will be described later). The synchronizing signal includes a vertical synchronizing signal, a horizontal synchronizing signal, and a dot clock signal.

The control circuit 3 creates various control signals according to the synchronizing signal and supplies the created signals to the display panel 10. Specifically, the control circuit 3 supplies, to the display panel 10, control signals Ctr1 to Ctr 3, Gini, /Gini, Gcpl, /Gcpl, Sel(1), Sel(2), Sel(3), /Sel(1), /Sel(2), and/Sel(3). Each of the control signals Ctr1 to Ctr3 includes a plurality of signals such as a pulse signal, a clock signal, an enable signal. The control signal Gini is a positive-logic control signal, and the control signal/Gini is a negative-logic control signal, the logic of which is inverted with respect to the control signal Gini. The control signal Gcpl is also a positive-logic control signal, and the control signal/Gcpl is a negative-logic control signal, the logic of which is inverted with respect to the control signal Gcpl. The control signal/Sel(1) has a logic inverted with respect to the control signal Sel(1). Similarly, the control signal/Sel(2) has a logic inverted with respect to the control signal Sel(2), and the control signal/Sel(3) has a logic inverted with respect to the control signal Sel(3). The control signal Sel(1), Sel(2), and Sel(3) will sometimes be collectively referred to below as the control signal Sel, and the/Sel(1), /Sel(2), and /Sel(3) will sometimes be collectively referred to below as the control signal/Sel. A voltage generating circuit 31 receives electric power from the power supply circuit 2 and supplies a reset potential Vorst, an initial potential Vini, and the like to the display panel 10.

The control circuit 3 further creates an image signal Vid in analog form from the image data Video. Specifically, the control circuit 3 has a lookup table in which the potential indicated by the image signal Vid and the brightness of the electro-optical device (OLED 130 described later) included in the display panel 10 are stored in correspondence with each other. With reference to the lookup table, the control circuit 3 creates the image signal Vid indicating the potential corresponding to the brightness of the electro-optical element, the brightness being stipulated by the image data Video, after which the control circuit 3 supplies the created signal to the display panel 10.

As illustrated in FIG. 2, the display panel 10 includes the display section 100 and a driving circuit (composed of a scanning line driving circuit 4A, a dummy scanning line driving circuit 4B, and a data transfer line driving circuit 5) that drives the display section 100. Although, in this embodiment, the driving circuit is divided into the scanning line driving circuit 4A, dummy scanning line driving circuit 4B, and data transfer line driving circuit 5, the driving circuit may be formed by combining these circuits into one circuit. As illustrated in FIG. 2, the display section 100 includes a pixel matrix section 100A and a dummy pixel section 100B. In the pixel matrix section 100A, pixel circuits 110 corresponding to the pixels of an image to be displayed are arranged in the form of a matrix. Although not illustrated in detail in FIG. 2, the pixel matrix section 100A includes scanning lines 12A, extending horizontally (in the X direction) in the drawing, in M rows, and also includes data transfer lines 14, extending vertically (in the Y direction) in the drawing, in (3N) columns, data transfer lines 14 in each three columns being grouped. The scanning lines 12A and data transfer lines 14 are disposed so as to be electrically isolated from each other. One pixel circuit 110 is provided for each of intersections between scanning lines 12A in M rows and data transfer lines 14 in (3N) columns. In this embodiment, therefore, pixel circuits 110 are arranged in a matrix of M rows horizontally and (3N) columns vertically.

Here, both M and N each are a natural number. To distinguish the scanning lines 12A and the rows in the matrix of pixel circuits 110, the rows will sometimes be referred to as row 1, row 2, row 3, . . . , row (M−1), and row M sequentially from the scanning line 12A at the top in the drawing. Similarly, to distinguish the data transfer lines 14 and the columns in the matrix of pixel circuits 110, the columns will sometimes be referred to as column 1, column 2, column 3, . . . , column (3N−1), and column (3N)

sequentially from the data transfer line 14 at the left end in the drawing. If any integer equal to or larger than 1 is represented as j to generally explain a group of data transfer lines 14, the j-th group counted from the left end includes data transfer lines 14 in the (3j–2)th, (3j–1)th, and (3j)th columns. Three pixel circuits 110 corresponding to the scanning line 12A in one row and to the data transfer lines 14 in three columns belonging to the same group correspond to red (R), green (G), and blue (B) pixels. These three pixels represent one dot of a color image to be displayed. That is, in this embodiment, the color of one dot is represented by additive color mixture in which light emitted by OLEDs corresponding to RGB is used.

As illustrated in FIG. 2, the display section 100 includes power supply lines (reset potential supply lines) 16, extending vertically, in (3N) columns, the power supply lines 16 being provided so as to be electrically isolated from the scanning lines 12A. A predetermined reset potential Vorst is supplied from the voltage generating circuit 31 to all power supply lines 16 in common. To distinguish the columns of the power supply lines 16, they will sometimes be referred to as the power supply line 16 in the first column, the power supply line 16 in the second column, the power supply line 16 in the third column, . . . , and the power supply line 16 in the (3N)th column sequentially from the data transfer line 14 at the left end in the drawing. The power supply lines 16 in the first to (3N)th columns are respectively provided in correspondence to the data transfer lines 14 in the first to (3N)th columns.

As illustrated in FIG. 2, the dummy pixel section 100B includes a dummy scanning line 12B, extending horizontally, in one row, and also includes data transfer lines 14 in (3N) columns and power supply lines 16 in (3N) columns so as to be electrically isolated from each other. In the dummy pixel section 100B, a dummy circuit 112 is provided for each of the intersections between data transfer lines 14 in (3N) columns and the dummy scanning line 12B. That is, in this embodiment, dummy circuits 112 are arranged in a matrix of one row horizontally and (3N) columns vertically. The structures of the pixel circuit 110 and dummy circuit 112 will be clarified later.

The scanning line driving circuit 4A creates scanning signals Gwr used to sequentially select scanning lines 12A in M rows, one at a time, in one frame period, according to the control signal Ctr1. Scanning signals Gwr supplied to scanning lines 12A in the first row, second row, third row, . . . , and Mth row are respectively represented as scanning signals Gwr(1), Gwr(2), Gwr(3), . . . , Gwr(M–1), and Gwr(M). Although not illustrated in FIG. 2, in addition to scanning signals Gwr(1) to Gwr(M), the scanning line driving circuit 4A creates various control signals synchronous with these scanning signals Gwr for each row and supplies the created signals to the pixel matrix section 100A. The frame period refers to a period taken by the electro-optical device 1 to display an image for one cut (frame). If the frequency of a vertical synchronous signal included in a synchronous signal is at, for example, 120 Hz, the frame period is a period of 8.3 milliseconds equal to one cycle of the vertical synchronous signal. The frame period is divided into a display period and a blanking period. The scanning line driving circuit 4A creates the above control signals differently between the display period and the blanking period to control the pixel circuit 110. In the display period, the scanning line driving circuit 4A creates the control signals so that a compensation operation to compensate the property of the driving transistor is executed in the pixel circuit 110 in the selected row. In the blanking period, the scanning line driving circuit 4A creates the control signals so that the compensation operation is not executed in any pixel circuit 110. Details of this will be described later.

The dummy scanning line driving circuit 4B creates a scanning signal Gwr[dum] used to select the dummy scanning line 12B in the blanking period, according to control signal Ctr3. Although not illustrated in FIG. 2, in addition to the scanning signal Gwr[dum], the dummy scanning line driving circuit 4B also creates various control signals synchronous with the scanning signal and supplies the created signal to the dummy pixel section 100B.

As illustrated in FIG. 2, the data transfer line driving circuit 5 includes 3N level shift circuits LS provided in one-to-one correspondence with data transfer lines 14 in (3N) columns, N demultiplexers DM, each of which is provided for data transfer lines 14 in three columns forming a group, and a data signal supply circuit 70.

The data signal supply circuit 70 creates data signals Vd(1), Vd(2), . . . , and Vd(N) according to the image signal Vid and control signal Ctr2 supplied from the control circuit 3. That is, the data signal supply circuit 70 creates data signals Vd(1), Vd(2), . . . , and Vd(N) according to the image signal Vid resulting from the time-division multiplexing of data signals Vd(1), Vd(2), . . . , and Vd(N). The data signal supply circuit 70 then respectively supplies data signals Vd(1), Vd(2), . . . , and Vd(N) to the demultiplexers DM corresponding to the first, second, . . . , and N-th groups.

Figure 3:
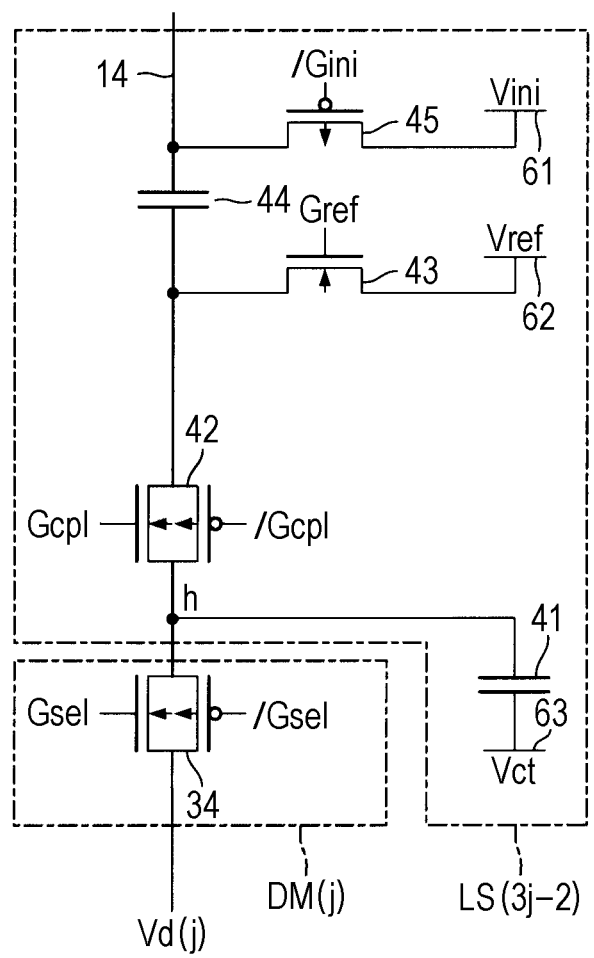
FIG. 3 is a circuit diagram illustrating the structure of a data transfer line driving circuit in the electro-optical device.

FIG. 3 is a circuit diagram illustrating the structures of the demultiplexer DM and level shift circuit LS. As a typical demultiplexer DM and level shift circuit LS, FIG. 3 indicates the demultiplexer DM belonging to the j-th group and one of the three level shift circuits LS connected to the demultiplexer DM (the one level shift circuit is, for example, the level shift circuit is connected to the 3j–2nd data transfer line 14). In the description below, the demultiplexer DM belonging to the j-th group will sometimes be represented as the demultiplexer DM(j).

The structures of the demultiplexer DM and level shift circuit LS will be described below with reference to FIGS. 2 and 3. As illustrated in FIG. 3, the demultiplexer DM is an aggregation of a transmission gate 34, which is provided for each column. The demultiplexer DM sequentially supplies data signals to three columns forming a group. The input ends of the transmission gates 34 corresponding to columns (3j–2), (3j–1), and (3j) in the j-th group are mutually connected in common. Data signal Vd(j) is supplied to each of the common terminals of these transmission gates 34. The transmission gate 34 disposed in column (3j–2), which is the left column in the j-th group, is turned on (electrically connected) when control signal Sel(1) is at a high (H) level (control signal/Sel(1) is at a low (L) level). Similarly, the transmission gate 34 disposed in column (3j–1), which is the central column in the j-th group, is turned on when control signal Sel(2) is at the H level (control signal/Sel(2) is at the L level); the transmission gate 34 disposed in column (3j), which is the right column in the j-th group, is turned on when control signal Sel(3) is at the H level (control signal/Sel(3) is at the L level).

The level shift circuit LS has a group of storage capacitors 41 and 44, a transmission gate 42, a transistor 43 of N-channel MOS type, and a transistor 45 of P-channel MOS type. The level shift circuit LS supplies, to the storage capacitor 44, the potential of the data signal output from the output end of the transmission gate 34 in the relevant column, and also supplies a potential different from the potential of the data signal to the data transfer line 14. Since the input side and output side of the storage capacitor 44 are set to different levels, the level shift circuit LS is called as its name suggests. One end of the storage capacitor 44 is connected to the data transfer line 14 in the relevant column and to the drain of the transistor 45, and the other end of the storage capacitor 44 is connected to the output end of the transmission gate 34 and the drain of the transistor 43.

The source of the transistor 45 is electrically connected to a power supply line 61. The power supply line 61 is connected to the voltage generating circuit 31, so the power supply line 61 is given a predetermined initial potential Vini from the voltage generating circuit 31. The control circuit 3 supplies the control signal/Gini to the gate of the transistor 45. The transistor 45 electrically connects the data transfer line 14 and power supply line 61 together when the control signal/Gini is at the L level, and electrically disconnects them when the control signal /Gini is at the H level.

The source of the transistor 43 is electrically connected to a power supply line 62. The power supply line 62 is connected to the power supply circuit 2, so the power supply line 62 is given a potential Vref. A control signal Gref is supplied to the gate of the transistor 43. Therefore, the transistor 43 electrically connects the other end of the storage capacitor 44 and the power supply line 62 together when the control signal Gref is at the H level, and electrically disconnects them when the control signal Gref is at the L level.

The storage capacitor 41 has two electrodes. One electrode of the storage capacitor 41 is electrically connected to the input end of the transmission gate 42 through a node h. The output end of the transmission gate 42 is electrically connected to the data transfer line 14. The control circuit 3 supplies the control signal Gcpl and control signal/Gcpl to the transmission gate 42. Therefore, when the control signal Gcpl is at the H level (the control signal/Gcpl is at the L level), the transmission gate 42 is turned on.

Besides being electrically connected to the input end of the transmission gate 42 as described above, the one electrode of the storage capacitor 41 is electrically connected to the output end of the transmission gate 34 through the node h. When the transmission gate 34 is turned on, data signal Vd(j) is supplied to the one electrode of the storage capacitor 41 through the output end of the transmission gate 34. That is, the storage capacitor 41 is given data signal Vd(j) at the one electrode. The other electrode of the storage capacitor 41 in each column is connected to a power supply line 63 in common. A potential Vct, which is a fixed potential, is supplied from the power supply circuit 2 to the power supply line 63. The potential Vct may be equivalent to the L level of a scanning signal or a control signal, which is a logical signal.

The pixel circuit 110 and dummy circuit 112 will be described with reference to FIG. 4. To generally indicate a row in which pixel circuits 110 are arranged, an arbitrary integer that is at least 1 and at most M is represented as m. From an electrical viewpoint, all pixel circuits 110 have the same structure. In the description below, therefore, the pixel circuit 110 in row m and column (3j−2), which is positioned in the m-th row and (3j−2)th column, and the dummy circuit 112 in column (3j−2) will be taken as an example.

The pixel circuit 110 and dummy circuit 112 are connected to the data transfer line 14 in the (3j−2)th column. As will be clarified from FIG. 4, in this embodiment, the pixel circuit 110 and dummy circuit 112 have the same structure and differ from each other only in control signals supplied to them. The pixel circuit 110 in the m-th row, for example, is given scanning signal Gwr(m) and control signals Gcmp(m), Gel(m) and Gorst(m) from the scanning line driving circuit 4A. By contrast, the dummy circuit 112 is given Gwr(dum) and control signals Gcmp(dum), Gel(dum) and Gorst(dum) from the dummy scanning line driving circuit 4B. Therefore, the structure of only the pixel circuit 110 will be described below.

The pixel circuit 110 is given a gray-scale voltage corresponding to a specified gray-scale through the data transfer line 14 to which the pixel circuit 110 is connected. The pixel circuit 110 includes a first transistor 121, a second transistor 122, a third transistor 123, a fourth transistor 124, and a fifth transistor 125, each of which is a P-channel MOS transistor, as well as an OLED 130 and a pixel capacitor 132. In the description below, the first transistor 121, second transistor 122, third transistor 123, fourth transistor 124, and fifth transistor 125 will sometimes be referred to as the transistors 121 to 125.

Figure 4:
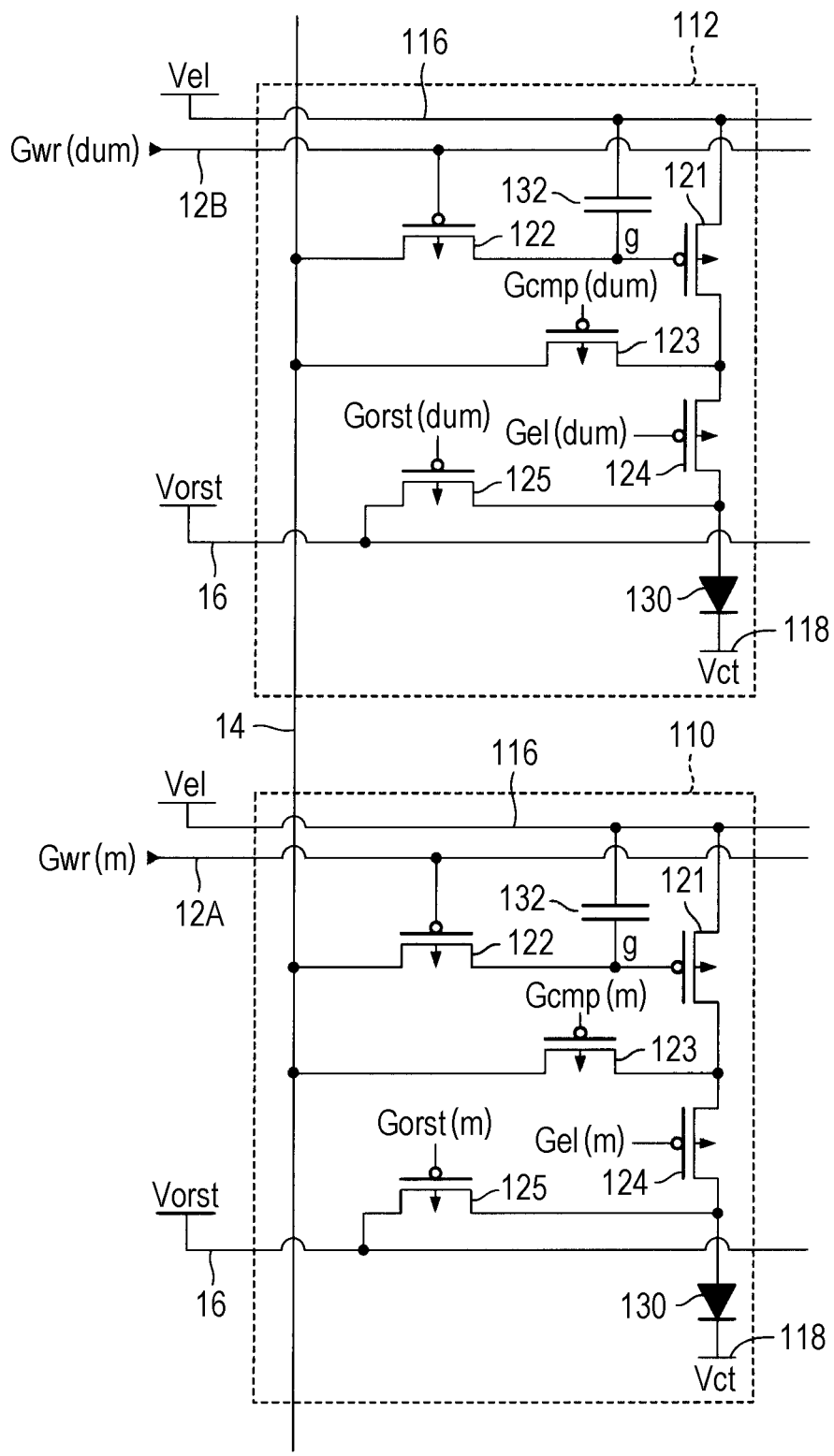
FIG. 4 is a circuit diagram illustrating the structure of a pixel circuit in the electro-optical device.

The gate of the second transistor 122 is electrically connected to the relevant scanning line 12A (in FIG. 4, the scanning line 12A in the m-th row). One of the source and drain of the second transistor 122 is electrically connected to the relevant data transfer line 14 (in FIG. 4, the data transfer line 14 in the (3j−2)th column). The other of the source and drain of the second transistor 122 is electrically connected to the gate of the first transistor 121 and one of the electrodes of the pixel capacitor 132. The second transistor 122 functions as a switching transistor that controls an electrical connection between the gate of the first transistor 121 and the data transfer line 14 in the column in the (3j−2)th column.

The drain of the first transistor 121 is electrically connected to a power supply line 116. The power supply line 116 is connected to the power supply circuit 2, so the power supply line 116 is given a potential Vel, which is a high-level power supply potential in the pixel circuit 110, from the power supply circuit 2. The first transistor 121 functions as a driving transistor that causes a current matching a voltage between the gate and the drain to flow into the OLED 130.

One of the source and drain of the third transistor 123 is electrically connected to the relevant data transfer line 14, and the other is electrically connected to the drain of the first transistor 121. The gate of the third transistor 123 is given control signal Gcmp(m). The third transistor 123 electrically connects the gate and drain of the first transistor 121 through the second transistor 122. That is, the third transistor 123 functions as a switching transistor that controls an electrical connection between the gate and drain of the first transistor 121. Although the second transistor 122 is connected between the gate of the first transistor 121 and one of the source and drain of the third transistor 123, this connection can also be interpreted as an electrical connection of one of the source and drain of the third transistor 123 to the gate of the first transistor 121.

The source of the fourth transistor 124 is electrically connected to the drain of the first transistor 121. The drain of the fourth transistor 124 is electrically connected to the anode of the OLED 130. One of the source and drain of the fifth transistor 125 is electrically connected to the power supply line 16 in the (3j−2)th column, that is, a potential line through which the reset potential Vorst is supplied. The other of the source and drain of the fifth transistor 125 is connected to the drain of the fourth transistor 124.

The gate of the fourth transistor 124 is given control signal Gel(m). The fourth transistor 124 functions as a switching transistor that controls an electrical connection between the drain of the first transistor 121 and the anode of the OLED 130. Although the fourth transistor 124 is connected between the drain of the first transistor 121 and the anode of the OLED 130, this connection can also be interpreted as an electrical connection of the drain of the first transistor 121 to the anode of the OLED 130. The gate of the fifth transistor 125 is given control signal Gorst(m). The fifth transistor 125 functions as a switching transistor that controls an electrical connection between the power supply line 16 and the anode of the OLED 130.

In this embodiment, the display panel 10 is formed on a silicon circuit board and the circuit board potential of the transistors 121 to 125 is potential Vel. The source and drain of the transistors 121 to 125 may be exchanged according to the channel type of the transistors 121 to 125 and to their potentials. These transistors may be thin-film transistors or may be field-effect transistors.

One of the electrodes of the pixel capacitor 132 is electrically connected to the gate g of the first transistor 121, and the other is electrically connected to the power supply line 116. Therefore, the pixel capacitor 132 functions as a storage capacitor that stores a voltage between the gate and drain of the first transistor 121. The pixel capacitor 132 may be a capacitor parasitic on the gate g of the first transistor 121 or may be a capacitor formed by sandwiching an insulating layer between different conductive layers on the silicon circuit board.

The anode of the OLED 130 is a pixel electrode provided individually for each pixel circuit 110. By contrast, the cathode of the OLED 130 is a common electrode 118 shared by all pixel circuits 110. The cathode is connected to the power supply line 63. The OLED 130 is an element in which a white organic electroluminescent (EL) layer is sandwiched between the anode and light-transmitting cathode of the OLED 130 on the above silicon circuit board. A color filter corresponding to any one color of RGB is overlaid on the emitting side (cathode side) of the OLED 130. To set the wavelength of light emitted from the OLED 130, a cavity structure may be formed by adjusting the optical distance between two reflection layers disposed so as to sandwich the white organic EL layer. In this case, a color filter may be provided or may not be provided.

When a current flows from the anode of the OLED 130 into its cathode, a positive hole injected from the anode and an electron injected from the cathode are coupled again in the organic EL layer, creating an exciter and thereby emitting white light. White light emitted at that time is transmitted through the cathode disposed opposite to the silicon circuit board (anode) and is colored by the color filter, enabling the light to be visually recognized by the observer.

Operations in the First Embodiment

Figure 5:
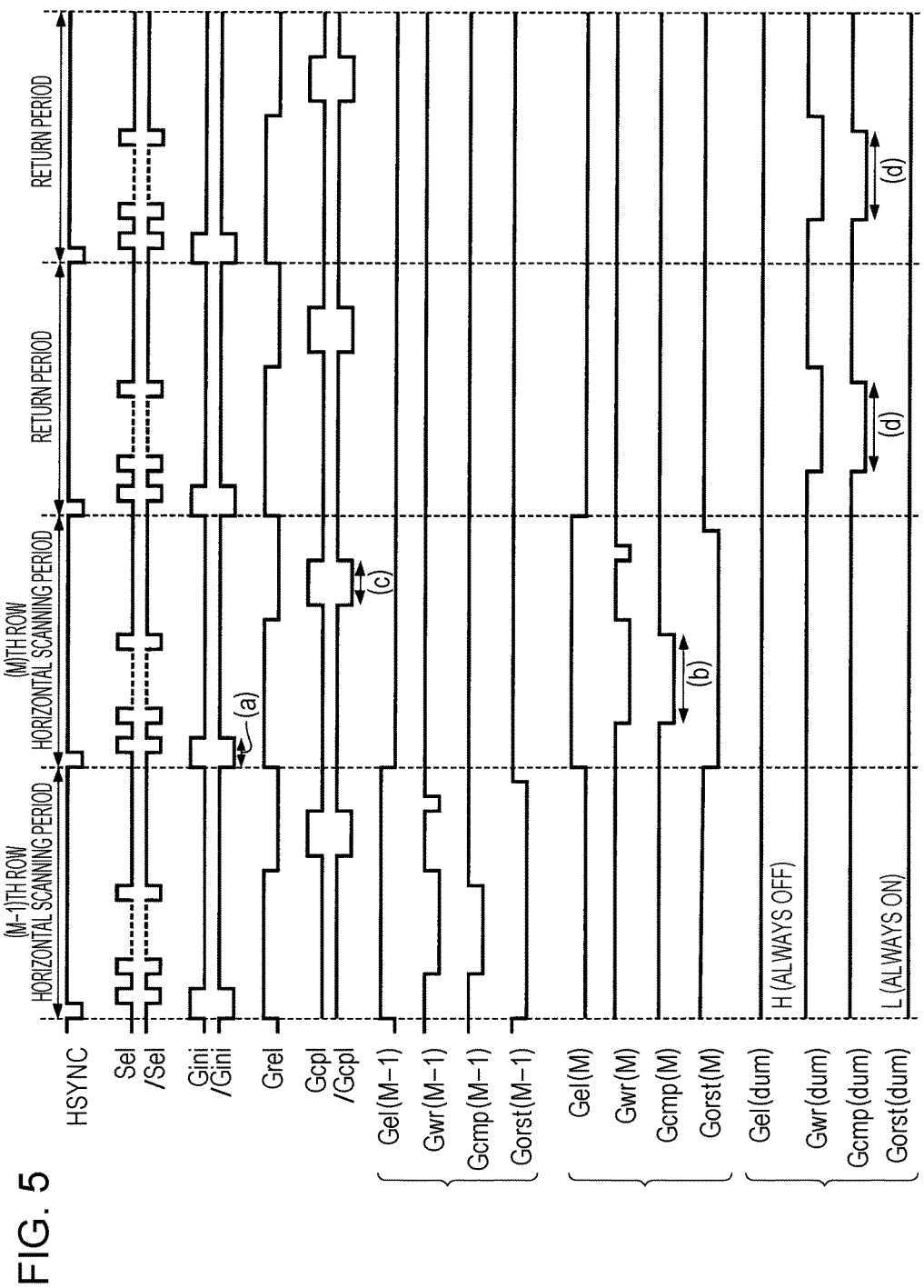
FIG. 5 is a timing diagram indicating operations of the electro-optical device.

Operations of the electro-optical device 1 will be described with reference to FIG. 5. FIG. 5 is a timing diagram indicating operations of individual sections in the electro-optical device 1. In this embodiment, scanning signals Gwr(1) to Gwr(M) are sequentially switched to the L level. In the display period in one frame period, the scanning lines 12A in the first to M-th rows are selected in turn, one scanning line 12A being selected in each horizontal scanning period (H). A gray-scale voltage is written to the pixel circuit 110 corresponding to the selected scanning line 12A. The gray-scale voltage is held in the pixel capacitor 132 until a scanning line 12A is selected during the display period in the next frame period, so a light-emitting state matching the gray-scale voltage is held. That is, the light-emitting state in which the pixel circuit 110 is emitting light is maintained even during the blanking period that starts after the end of the display period. During the blanking period in one frame period, the dummy circuit 112 is selected. The operation in one horizontal scanning period (H) is common to the pixel circuits 110 in all rows. Therefore, operations will be described below, focusing particularly on the pixel circuit 110A in row M and column (3*j*−2) and the dummy circuit 112 in column (3*j*−2) in a horizontal scanning period during which the (M−1)th row is selected (this period will be referred to as the (M−1)th row horizontal scanning period), a horizontal scanning period during which the M-th row is selected (this period will be referred to as the (M)th row horizontal scanning period), and the blanking period.

In this embodiment, the (i)th row horizontal scanning period, that is, the period during which the pixel circuit 110 in the i-th row is selected, is broadly divided into an initialization period indicated by (a) in FIG. 5, a compensation period indicated by (b), and a writing period indicated by (c). After the writing period indicated by (c), the pixel circuit 110 in the i-th row enters the light emitting state. After the elapse of one frame period, the (i)th row horizontal scanning period starts again. In a sequence in time, after the light emitting period, the initialization period and the compensation period and writing period are performed in this order, after which the light emitting period starts again. This cycle is repeated. A period from when the initialization period starts until the writing period terminates is an operation period related to the writing of data to the pixel corresponding to the selected scanning line 12A. The operation period includes a period during which data is written and a period during which an operation needed to write data is executed. The initialization period, compensation period, and writing period are exemplary. That is, one horizontal scanning period (H) is a combination of an operation period and a transition period. In this embodiment, to adjust the brightness of the entire screen, the control circuit 3 controls the state of the OLED 130 so as to shift from the light emitting state to a light non-emitting state or vice versa during the transition period.

Light Emitting Period

Figure 6:
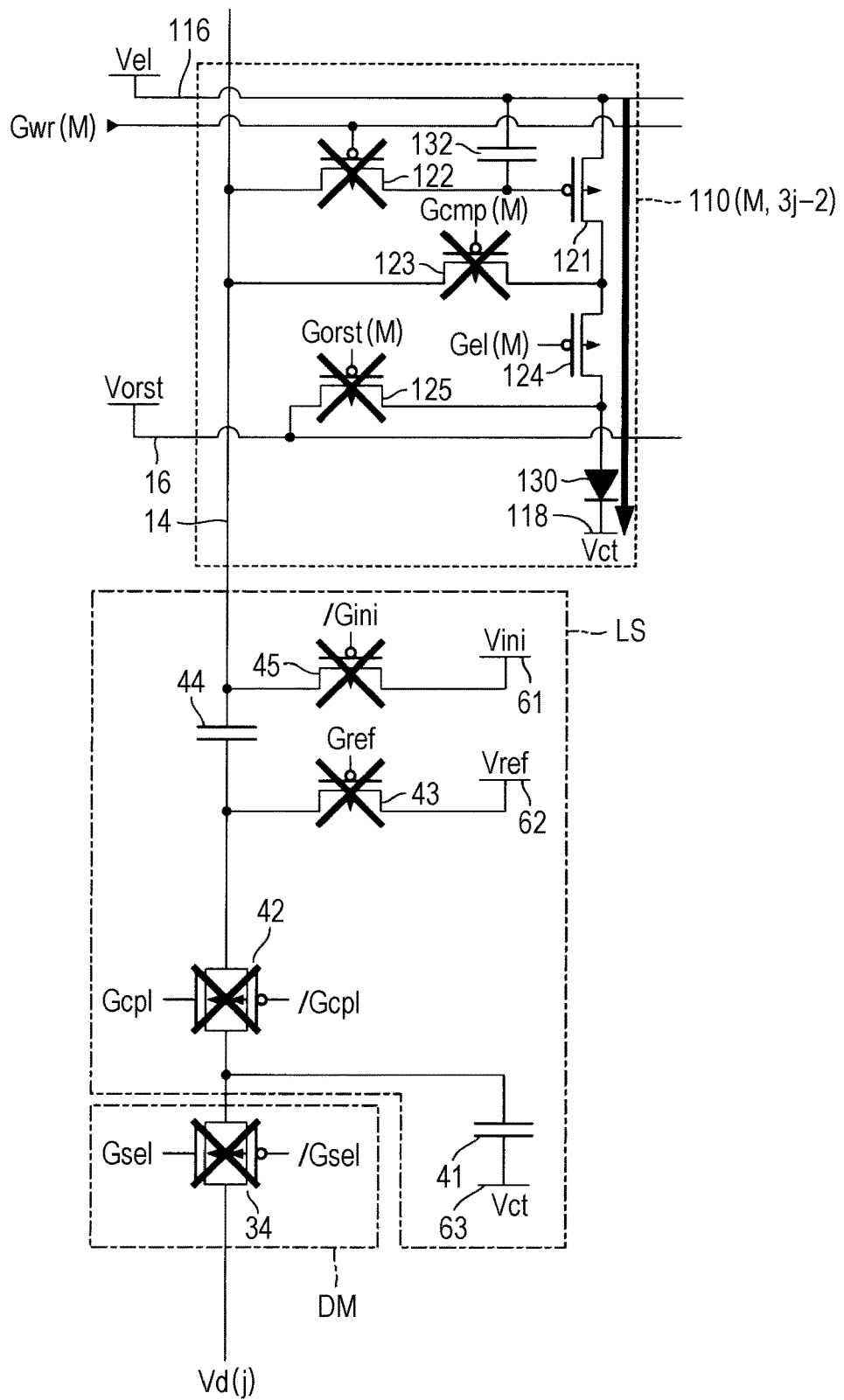
FIG. 6 illustrates an operation of the electro-optical device.

During the (M−1)th row horizontal scanning period illustrated in FIG. 5, the M-th row is placed in the light emitting period. For convenience of explanation, descriptions will start from the light emitting period, which is a premise for the initialization period. As illustrated in FIG. 5, during the light emitting period in the M-th row, scanning signal Gwr(M) output from the scanning line driving circuit 4A is at the H level. Of control signals Gel(M), Gcmp(M), and Gorst(M) output from the scanning line driving circuit 4A, Gel(M) is at the L level and Gcmp(M) and Gorst(M) are at the H level. As illustrated in FIG. 6, therefore, in the pixel circuit 110 in row M and column (3*j*−2), the fourth transistor 124 is turned on and the second transistor 122, third transistor 123, and fifth transistor 125 are turned off. Accordingly, the first transistor 121 converts a voltage held in the pixel capacitor 132, that is, a voltage between the gate and the drain, to a driving current and supplies it to the OLED 130. That is, the OLED 130 is given, from the first transistor 121, a current matching the gray-scale voltage matching a gray scale specified for the relevant pixel, and emits light with brightness matching the current. As illustrated in FIG. 5, the dummy scanning line driving circuit 4B maintains the control signal Gel(dum) at the H level and maintains the control signal Gorst(dum) at the L level, regardless of which of the display period and blanking period is in progress. Since the control signal Gel(dum) is held at the H level, the fourth transistor 124 in the dummy circuit 112 is kept turned off, so a dummy current does not flow into the OLED 130 in the dummy circuit 112. That is, the dummy circuit 112 does not enter the light emitting state, regardless of which of the display period and blanking period is in progress.

Furthermore, since the control signal Gorst(dum) is held at the L level, the fifth transistor 125 is kept turned on and the potential of the anode of the OLED 130 in the dummy circuit 112 is maintained at the reset voltage Vorst.

In the level shift circuit LS in the light emitting period, the control signal/Gini is at the H level. Therefore, as illustrated in FIG. 6, the transistor 45 is turned off and the control signal Gref thereby becomes the L level, so the transistor 43 is turned off and the control signal Gcpl thereby becomes the L level, turning off the transmission gate 42. In the demultiplexer DM in the light emitting period, the control signal Sel is at the L level, so the transmission gate 34 is turned off.

Figure 7:
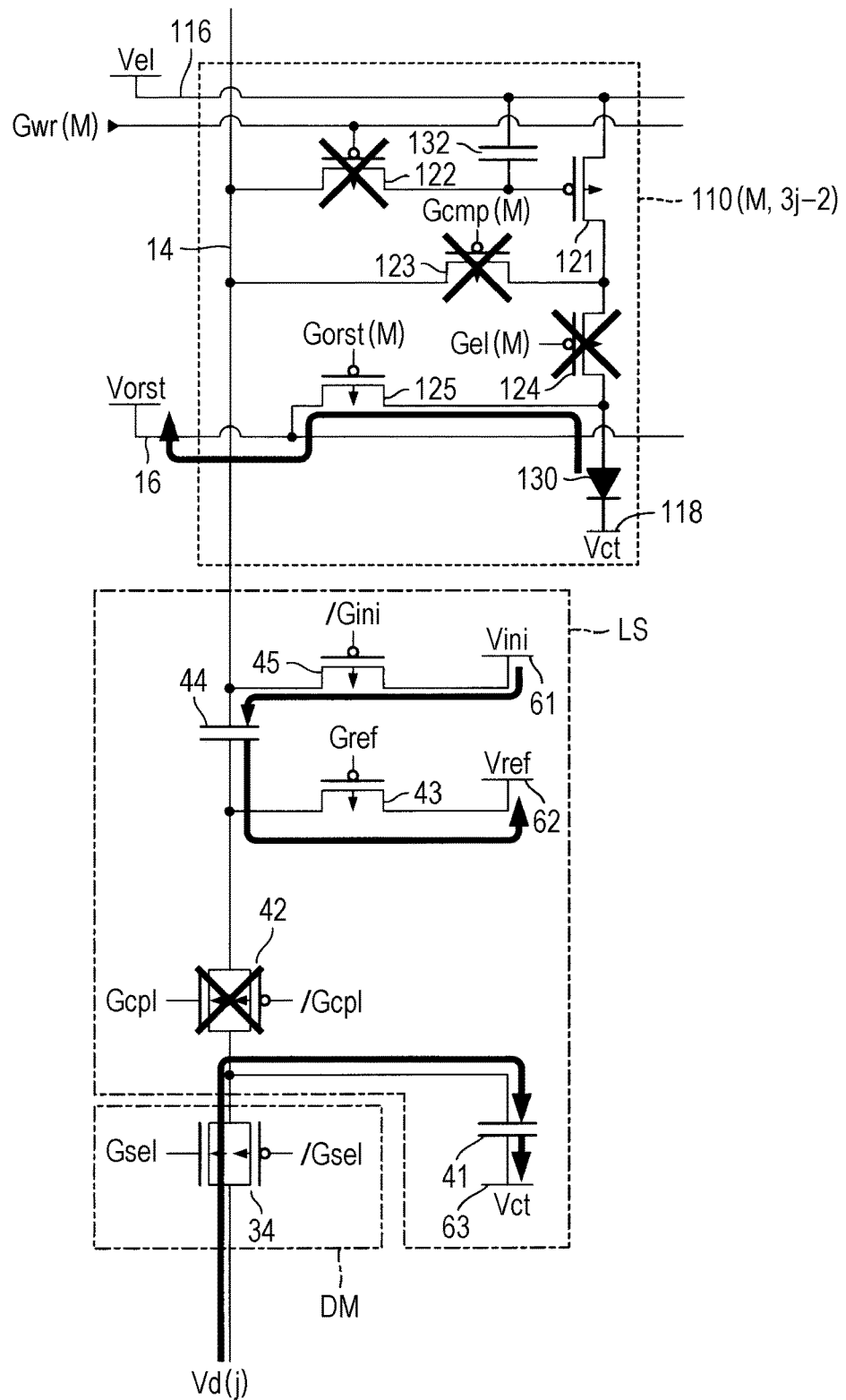
FIG. 7 illustrates another operation of the electro-optical device.

The light emitting period in the M-th row is a non-(M)th row horizontal scanning period (in the example in FIG. 5, the (M−1)th row horizontal scanning period), so the transmission gate 34, transmission gate 42, and transistor 45 are turned on and off according to the operations in these rows. Therefore, the potential of the data transfer line 14 appropriately changes. In the pixel circuit 110 in the M-th row, however, the second transistor 122 is in the turned-off state. Here, therefore, variations in the potential of the data transfer line 14 are not considered. Initialization period Upon the completion of the (M−1)th row horizontal scanning period, the (M)th row horizontal scanning period starts and the initialization period for the pixel circuit 110 in the M-th row (the period indicated (a) in FIG. 5) starts. As illustrated in FIG. 5, in the initialization period for the pixel circuit 110 in the M-th row, the scanning line driving circuit 4A sets scanning signal Gwr(M) to the H level, control signal Gel(M) to the H level, control signal Gcmp(M) to the H level, and control signal Gorst(M) to the L level. In the pixel circuit 110 in row M and column (3j−2), therefore, the fifth transistor 125 is turned on and the second transistor 122, third transistor 123, and fourth transistor 124 are turned off, as illustrated in FIG. 7. Thus, a path through which a current is supplied to the OLED 130 is broken, so the OLED 130 is turned off (enters the light non-emitting state). Since the fifth transistor 125 is turned off, the anode of the OLED 130 and the power supply line 16 are electrically connected together, setting the potential of the anode of the OLED 130 to the reset potential Vorst.

Figure 8:
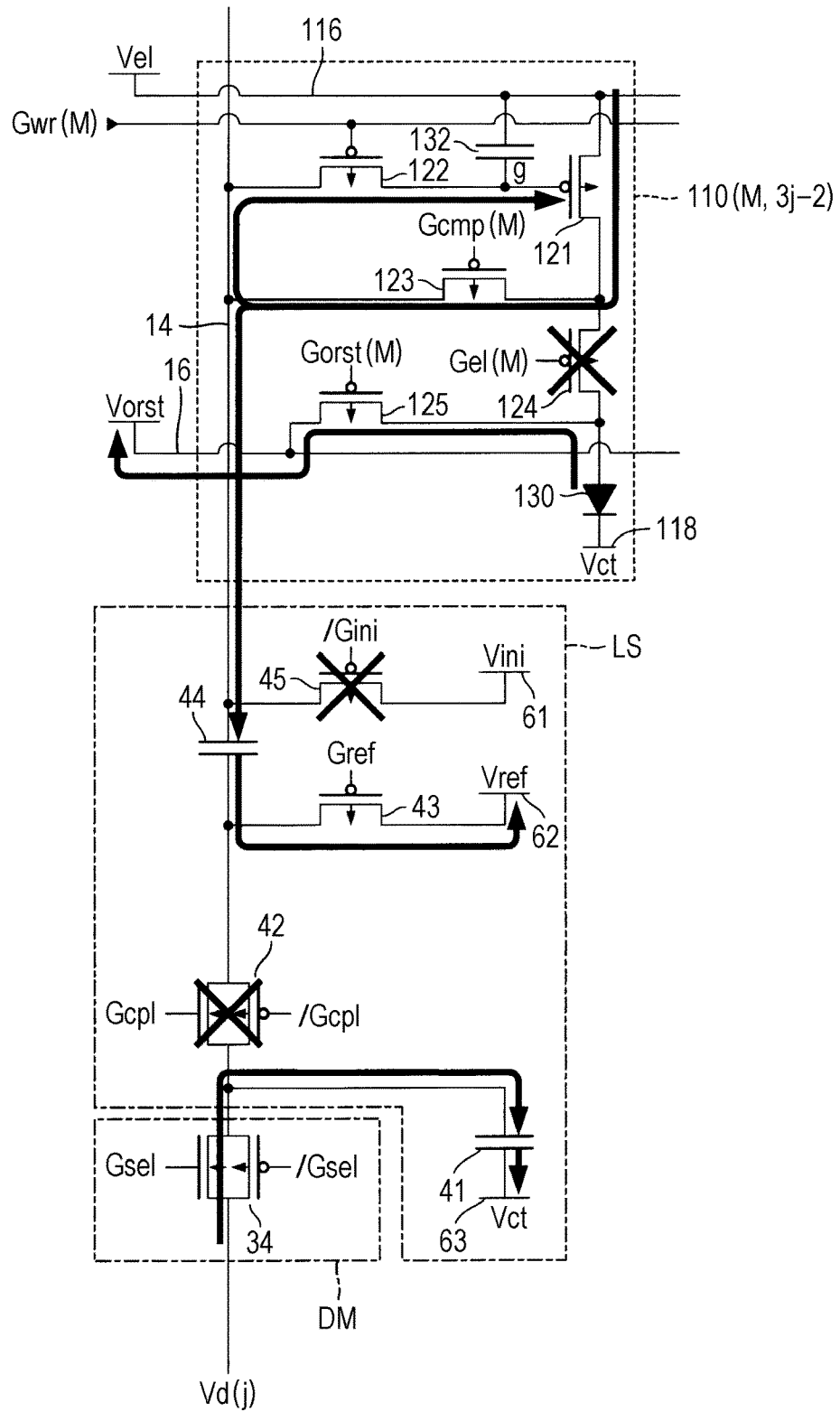
FIG. 8 illustrates another operation of the electro-optical device.

In the level shift circuit LS in the initialization period, the scanning control/Gini is at the L level. Therefore, the transistor 45 is turned on and the control signal Gref thereby becomes the H level, so the transistor 43 is turned on and the control signal Gcpl thereby becomes the L level, turning off the transmission gate 42. Therefore, as illustrated in FIG. 7, the data transfer line 14 is set to the initial potential Vini and the difference in potential in the storage capacitor 44 is initialized to the difference between the initial potential Vini and the potential Vref. In the demultiplexer DM in the initialization period, the control signal Sel is at the H level, so the transmission gate 34 is turned on as illustrated in FIG. 7. Thus, the gray-scale voltage is written to the storage capacitor 41.
Compensation Period Upon the completion of the initialization period described above, the compensation period indicated by (b) in FIG. 5 starts. In the compensation period for the pixel circuit 110 in the M-th row, the scanning line driving circuit 4A sets scanning signal Gwr(M) to the L level, control signal Gel(M) to the H level, control signal Gcmp(M) to the L level, and control signal Gorst(M) to the L level. In the pixel circuit 110 in row M and column (3j−2), therefore, the second transistor 122, third transistor 123, and fifth transistor 125 are turned on and the fourth transistor 124 is turned off, as illustrated in FIG. 8. At that time, the gate g of the first transistor 121 is connected to the source of the first transistor 121 through the second transistor 122 and third transistor 123 (this connection is referred to as a diode connection). Specifically, the source and gate g of the first transistor 121 are connected to the data transfer line 14. Assuming that the threshold voltage of the first transistor 121 is Vth, the potential Vg of the gate g of the first transistor 121 is brought close to a voltage matching the threshold voltage Vth in voltage-current conversion in the first transistor 121, which is specifically (Vel−Vth).

In the level shift circuit LS in the compensation period, the control signal/Gini is at the H level. Therefore, the transistor 45 is turned on and the control signal Gref thereby becomes the H level, so the transistor 43 is turned on and the control signal Gcpl thereby becomes the L level, turning off the transmission gate 42 (see FIG. 8). In the demultiplexer DM in the compensation period, the control signal Sel is at the H level, so the transmission gate 34 is turned on as illustrated in FIG. 8. Thus, the gray-scale voltage is written to the storage capacitor 41.

Figure 9:
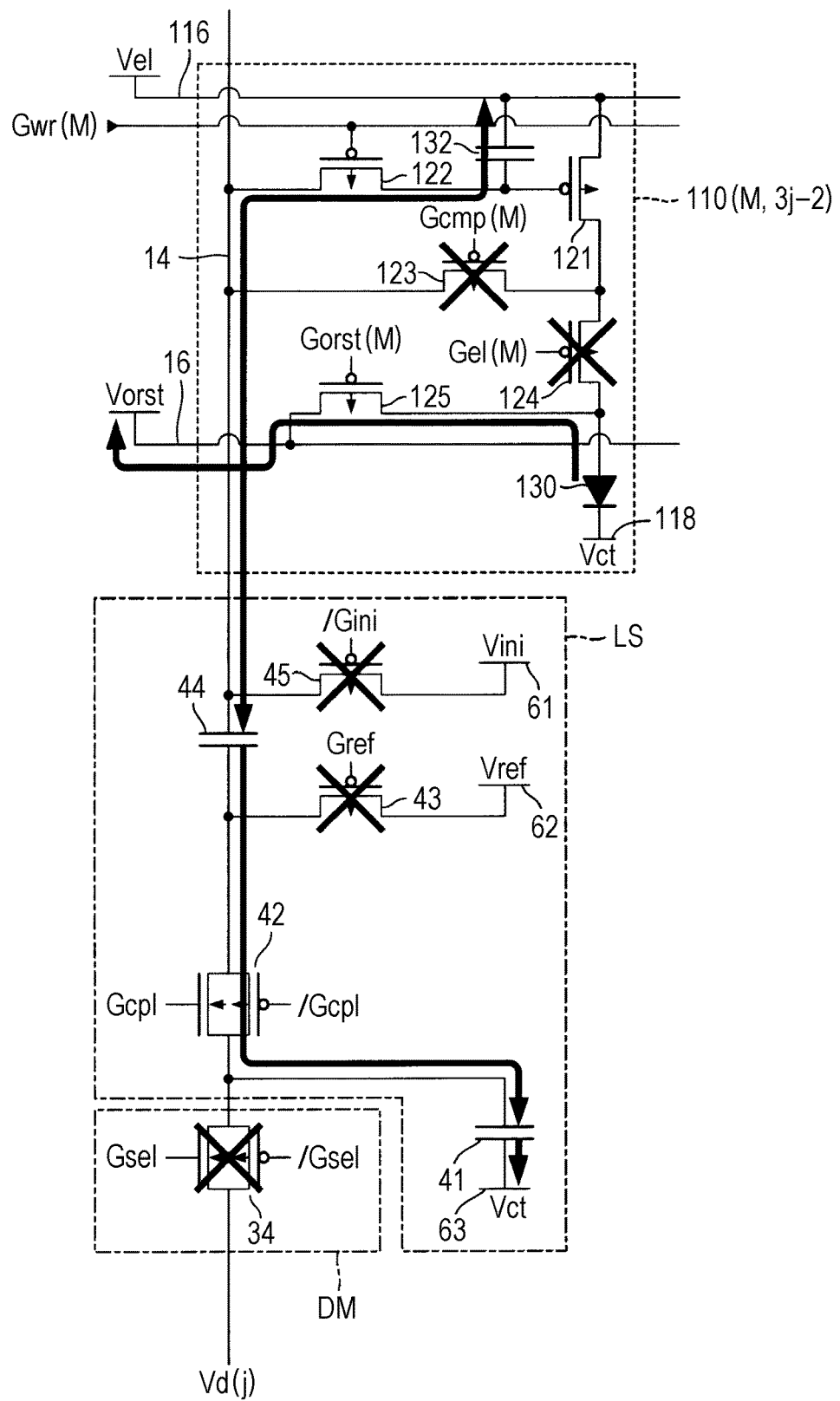
FIG. 9 illustrates another operation of the electro-optical device.

Since the fourth transistor 124 is in the turned-off state, the drain of the first transistor 121 is not electrically connected to the OLED 130. Since the fifth transistor 125 is in the turned-on state as in the initialization period, the anode of the OLED 130 and the power supply line 16 are electrically connected together and the potential of the anode of the OLED 130 is set to the reset potential Vorst.
Writing Period Upon the completion of the compensation period, the writing period indicated by (c) in FIG. 5 starts. In the writing period in the M-th row, the scanning line driving circuit 4A sets scanning signal Gwr(M) to the L level, control signal Gel(M) to the H level, control signal Gcmp(M) to the H level, and control signal Gorst(M) to the L level. In the pixel circuit 110 in row M and column (3j−2), therefore, the second transistor 122 and fifth transistor 125 are turned on and the third transistor 123 and fourth transistor 124 are turned off, as illustrated in FIG. 9.

Figure 10:
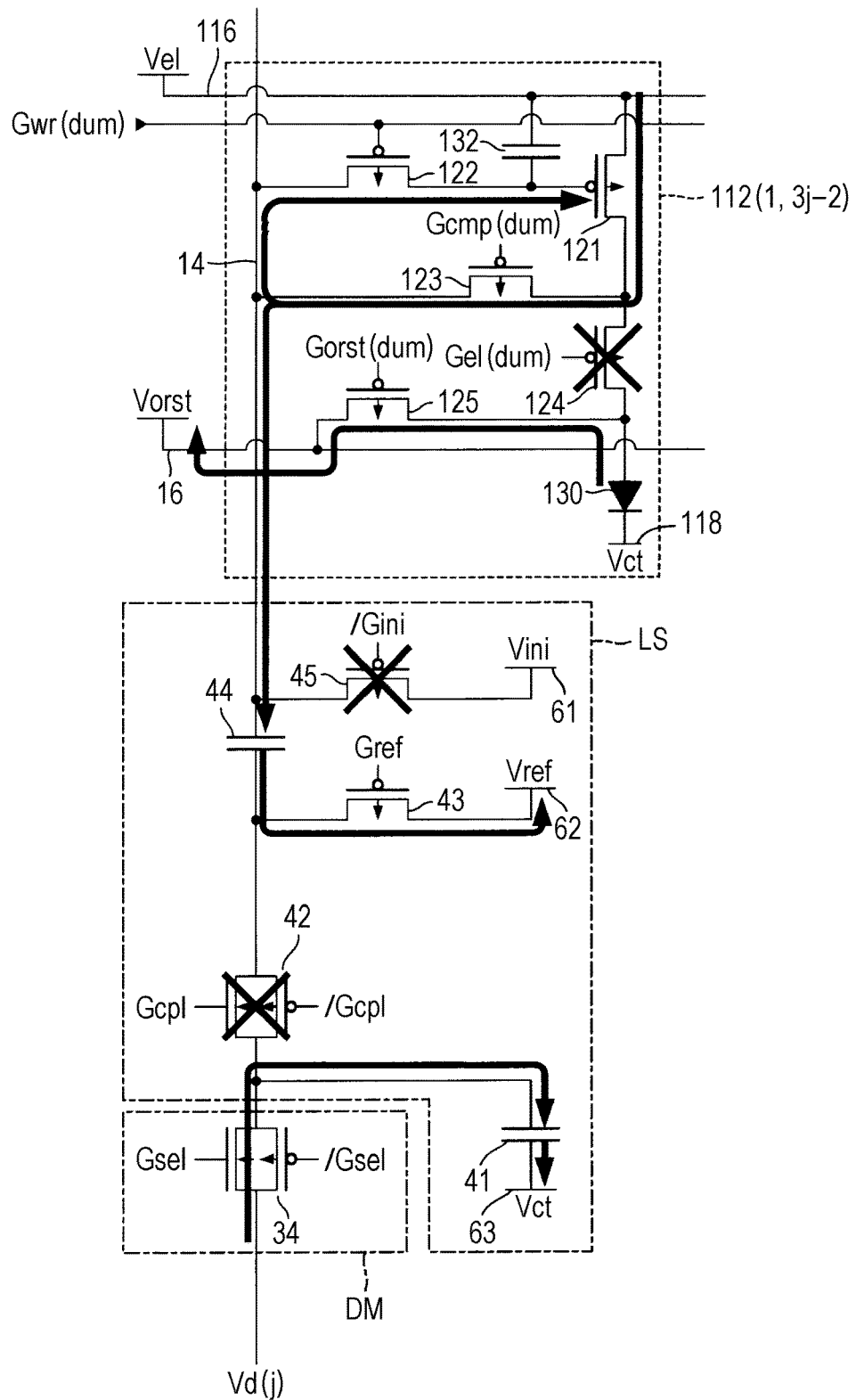
FIG. 10 illustrates another operation of the electro-optical device.

In the level shift circuit LS in the writing period, the control signal/Gini is at the H level. Therefore, the transistor 45 is turned off and the control signal Gref thereby becomes the L level, so the transistor 43 is turned off and the control signal Gcpl thereby becomes the H level, turning on the transmission gate 42, as illustrated in FIG. 9. Therefore, the supply of the initial potential Vini to the data transfer line 14 is stopped, and the gray-scale voltage held in the storage capacitor 41 is supplied to the gate of the first transistor 121 through the data transfer line 14 and is written to the pixel capacitor 132. In the demultiplexer DM in the writing period, the control signal Sel is at the L level, so the transmission gate 34 is turned off as illustrated in FIG. 9. Since the fourth transistor 124 is in the turned-off state, the source of the first transistor 121 is not electrically connected to the OLED 130. Since the fifth transistor 125 is in the turned-on state as in the initialization period, the anode of the OLED 130 and the power supply line 16 are electrically connected together and the potential of the OLED 130 is initialized to the reset potential Vorst.
Blanking Period Upon the completion of the (M)th row horizontal scanning period, the blanking period starts as illustrated in FIG. 5. In the blanking period, the pixel circuit 110 is maintained in the light emitting state, as described above. In this blanking period, the dummy scanning line driving circuit 4B causes the dummy circuit 112 to execute an operation equivalent to the operation for the pixel circuit 110 in the compensation period (this operation in the compensation period will be referred to as the compensation operation) (see (d) in FIG. 5). Specifically, the dummy scanning line driving circuit 4B sets both the scanning signal Gwr(dum) and control signal Gcmp(M) to the L level. As described above, the control signal Gel(dum) is held at the H level and the control signal Gorst(dum) is held at the L level. As a result, in the dummy circuit 112, the second transistor 122, third transistor 123, and fifth transistor 125 are turned on, and the fourth transistor 124 is turned off, as illustrated in FIG. 10. In the dummy circuit 112, therefore, the gate g of the first transistor 121 is connected to the source of the first transistor 121 through the second transistor 122 and third transistor 123 (that is, a diode connection is made). The source and gate g of the first transistor 121 in the dummy circuit 112 are connected to the data transfer line 14, and the potential Vg of the gate g of the first transistor 121 is brought close to a voltage (Vel−Vth) matching the threshold voltage Vth in voltage-current conversion in the first transistor 121. In the blanking period, since scanning line driving circuit 4A maintains the scanning signal Gwr(i) at the H level, the control signals Gcmp(M) and Gorst(M) at the H level, and the control signal Gel(M) at the L level, the pixel circuit 110 in the i-th row (i is 1 to M) maintains the light emitting state. In the blanking period, therefore, the compensation operation is not executed in any pixel circuit 110.

After the operation in the blanking period has been completed as described above, in this embodiment, the operation in the blanking period is re-executed, completing the operation in one frame period. Then, a next frame period starts. This completes the operation of the electro-optical device 1 in this embodiment. One of the features in this embodiment is to control the dummy circuit 112 so as to cause it to execute an operation equivalent to the compensation operation in the pixel circuit 110. The reason for this will be described below.

Figure 11:
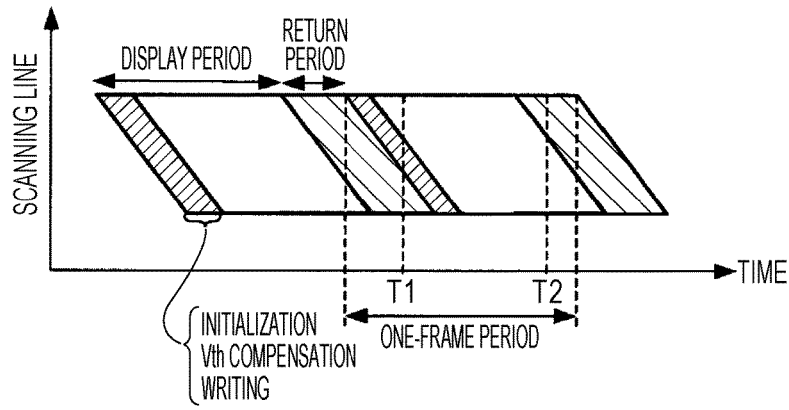
FIG. 11 illustrates an operation of a conventional electro-optical device.
Figure 12:
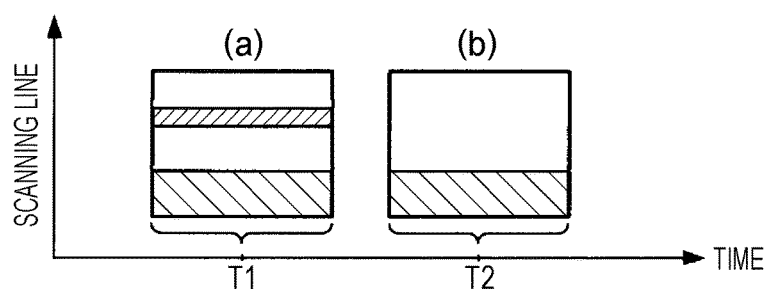
FIG. 12 illustrates another operation of a conventional electro-optical device.
Figure 13:
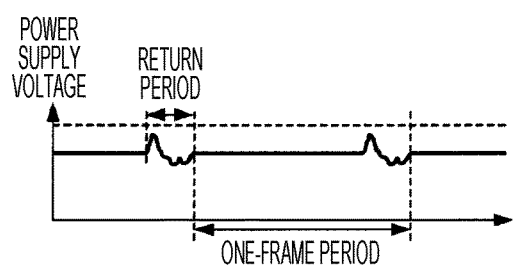
FIG. 13 illustrates another operation of a conventional electro-optical device.

FIG. 11 illustrates the operation of a conventional electro-optical device that lacks the dummy circuit 112 and thereby in which the above equivalent operation is not executed in the blanking period. Time T1 in FIG. 11 is a time within the display period. At time T1, any row in the pixel matrix is selected as illustrated in (a) in FIG. 12, and a compensation operation is performed in the pixel circuit belonging to the row. At time T2 included in the blanking period, there is no selected row in the pixel matrix as illustrated in (b) in FIG. 12, so a compensation operation is not performed. Since a compensation operation is not performed in any pixel circuit, power consumption in the pixel circuit in the blanking period is reduced and becomes less than power consumption in the display period by an amount by which electric power would otherwise be consumed in the compensation operation. Therefore, the power supply load varies, and the power supply voltage may thereby vary. FIG. 13 illustrates this variation in the power supply voltage. If a variation occurs in the power supply voltage as illustrated in FIG. 13, flicker occurs, deteriorating the display quality of the electro-optical device.

In this embodiment, however, the dummy circuit 112 is caused to execute an operation equivalent to the compensation operation in the pixel circuit 110. In addition, since the dummy circuit 112 has the same structure as the pixel circuit 110 as illustrated in FIG. 4, electric power consumed in the above equivalent operation is equal, in theory, to electric power consumed in the compensation operation in the pixel circuit 110. As described above, the dummy circuit 112 is a type of dummy circuit that does not enter the light emitting state in either of the display period and blanking period. However, this dummy circuit 112 executes an operation equivalent to the compensation operation in the blanking period. Therefore, loads on the power supply in the display period and blanking period can be made to approach each other. As a result, the dummy circuit 112 consumes electric power in the blanking period so that the total power consumption in the pixel circuit 110 and dummy circuit 112 in the display period and the total power consumption in the pixel circuit 110 and dummy circuit 112 in the blanking period more closely approach each other than when the dummy circuit 112 is not provided. That is, the dummy circuit 112 consumes electric power so that the difference between the total power consumption in the pixel circuit 110 and dummy circuit 112 in the display period and the total power consumption in the pixel circuit 110 and dummy circuit 112 in the blanking period becomes smaller than the difference between power consumption in the pixel circuit 110 in the display period and power consumption in the pixel circuit 110 in the blanking period.

Accordingly, the occurrence of a variation in the power supply voltage as illustrated in FIG. 13 can be reduced. This is the reason why the dummy circuit 112 executes an operation equivalent to the compensation operation in the pixel circuit 110.

It has been conventionally proposed to measure a transistor property in the blanking period. In measurement of a transistor property, however, electric power is not consumed as in a compensation operation for the transistor, so a variation in power supply voltage in the power supply circuit 2 cannot be necessarily avoided in the blanking period. In this embodiment, however, the pixel circuit 110 executes a compensation operation in the display period and the dummy circuit 112 having the same structure as the pixel circuit 110 executes an operation equivalent to the compensation operation in the blanking period. Therefore, the total power consumption in the pixel circuit 110 and dummy circuit 112 in the display period and the total power consumption in the pixel circuit 110 and dummy circuit 112 in the blanking period approach each other, reducing variations in the power supply voltage in the blanking period. Thus, in this embodiment, it is possible to avoid a variation in the power supply voltage in the blanking period, and to avoid deterioration in display quality caused by a variation in the transistor property of the driving transistor (first transistor 121) included in the pixel circuit.

In this embodiment, the storage capacitor 44 in the level shift circuit LS is charged (in other words, the data transfer line 14 is charged) in the compensation period for the pixel circuit 110. With an electro-optical device in which charging is performed as in this embodiment, the variation in the power supply voltage is further increased unless this charging is performed in the blanking period. Therefore, this embodiment is effective particularly for this type of electro-optical device. Although in this embodiment, the dummy pixel section 100B has been provided only in one row, dummy pixel sections 100B may be provided in a plurality of rows. If the pixel matrix section 100A includes, for example, 720 rows, dummy pixel sections 100B are preferably provided in about one to five rows. Although, in this embodiment, the dummy pixel section 100B has been provided separately from the pixel matrix section 100A, part of the pixel matrix section 100A may be used as a dummy pixel section (for example, the bottom row or another row that less affects display quality may be used). This is because the dummy circuit 112 has the same structure as the pixel circuit 110, as described above. Specifically, the pixel circuit 110 in a row in the pixel matrix section 100A other than the bottom row is used as a first pixel circuit and the pixel circuit 110 in the bottom row is used as a second pixel circuit. As described above, the first and second pixel circuits 110 each include the first transistor 121 and an electro-optical element (OLED 130), to which a current is supplied from the first transistor 121, and is driven in a frame period composed of the display period and blanking period. A driving circuit that drives the first and second pixel circuits 110 is caused to execute control as described below. In the display period, the driving circuit controls the first pixel circuit 110 so that it executes a compensation operation that compensates the property of the first transistor 121. In the blanking period, the driving circuit controls the first pixel circuit 110 so that it does not execute a compensation operation, and also controls the second pixel circuit 110 so that it executes an operation equivalent to the compensation operation so that power consumption in the pixel matrix section 100A in the display period and power consumption in the pixel matrix section 100A in the blanking period approach each other.

Second Embodiment

Figure 14:
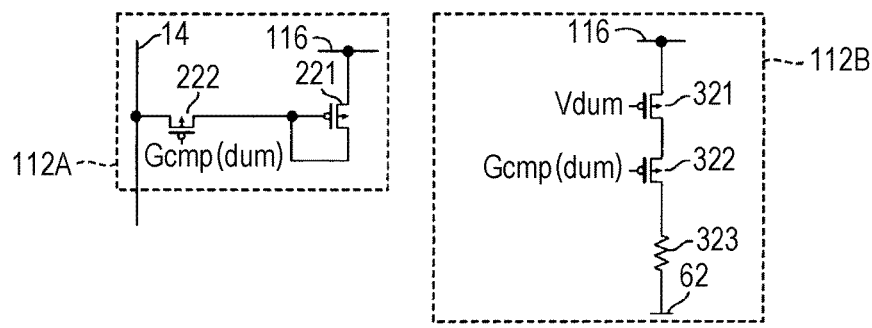
FIG. 14 illustrates an example of the structure of a pixel circuit included in an electro-optical device according to a second embodiment of the invention.

In the first embodiment, the dummy circuit 112 having the same structure as the pixel circuit 110 has been used to consume electric power in the blanking period so that the total power consumption in the pixel circuit 110 and dummy circuit 112 in the display period and the total power consumption in the pixel circuit 110 and dummy circuit 112 in the blanking period approach each other. However, the dummy circuit described above only needs to be a circuit equivalent to the pixel circuit 110 in a compensation operation; the dummy circuit is not limited to a circuit having the same structure as the pixel circuit 110. Specifically, a circuit structured so as to be electrically equivalent to the pixel circuit 110 acting during a compensation operation may be used as the above dummy circuit. This embodiment differs from the first embodiment in that a circuit structured so as to be electrically equivalent to the pixel circuit 110 when it is performing a compensation operation is used as the above dummy circuit, that is, the dummy circuit is used to structure the dummy pixel section 100B. Since the dummy pixel section 100B is not caused to emit light, a circuit forming the dummy pixel section 100B does not need to include an OLED. Specifically, it can be thought that a dummy circuit 112A or dummy circuit 112B illustrated in FIG. 14 is used instead of the dummy circuit 112 in the first embodiment.

The dummy circuit 112A includes a sixth transistor 221 and a seventh transistor 222, each of which is a P-channel MOS transistor. The drain of the sixth transistor 221 is electrically connected to the power supply line 116 through which a power supply potential is supplied to the driving transistor in the pixel circuit 110 (that is, the first transistor 121 in the pixel circuit 110). The gate and source of the sixth transistor 221 are mutually connected. One of the source and drain of the seventh transistor 222 is electrically connected to the data transfer line 14, and the other is electrically connected to the gate of the sixth transistor 221. The gate of the seventh transistor 222 is given the control signal Gcmp (dum) from the dummy scanning line driving circuit 4B. In the dummy circuit 112A, when the control signal Gcmp (dum) becomes the L level, the seventh transistor 222 is turned on and the sixth transistor 221 functions as a diode inserted between the power supply line 116 and the source or drain of the seventh transistor 222, whichever is connected to the gate of the sixth transistor 221. Therefore, if a transistor having a transistor property equivalent to that of the first transistor 121 in the pixel circuit 110 is used as the sixth transistor 221, the dummy circuit 112A functions, in the blanking period, as a circuit structured so as to be electrically equivalent to the pixel circuit 110 acting during a compensation operation.

The dummy circuit 112B includes an eighth transistor 321, a ninth transistor 322, and a resistor 323, which are connected in series between a first power supply line (in this embodiment, the power supply line 116) through which a first power supply potential is supplied and a second power supply line (in this embodiment, the power supply line 62) through which a second power supply potential is supplied. As illustrated in FIG. 14, both the eighth transistor 321 and the ninth transistor 322 are a P-channel MOS transistor. One of the source and drain of the eighth transistor 321 is electrically connected to the power supply line 116. One of the source and drain of the ninth transistor 322 is electrically connected to the other of the source and drain of the eighth transistor 321. The resistor 323 is electrically connected to the power supply line 62 and the other of the source and drain of the ninth transistor 322. The gate of the eighth transistor 321 is given the voltage Vdum that turns on the eighth transistor 321, that is, the voltage Vdum matching the threshold voltage for the eighth transistor 321. The gate of the ninth transistor 322 is given the control signal Gcmp (dum), that is, a control signal that turns on the ninth transistor 322 in the blanking period, from the dummy scanning line driving circuit 4B. In the dummy circuit 112B, when the control signal Gcmp(dum) becomes the L level, the ninth transistor 322 is turned on and a current flows from the power supply line 116 to the power supply line 62 through the eighth transistor 321, ninth transistor 322, and resistor 323. If the resistance of the resistor 323 and the transistor sizes of the eighth transistor 321 and ninth transistor 322 are set so that the pixel circuit 110 and dummy circuit 112B consume the same amount of electric power during the compensation operation, the structure of the dummy circuit 112B is electrically equivalent to the structure of the pixel circuit 110 acting during a compensation operation.

Variation and Application Example

Figure 15:
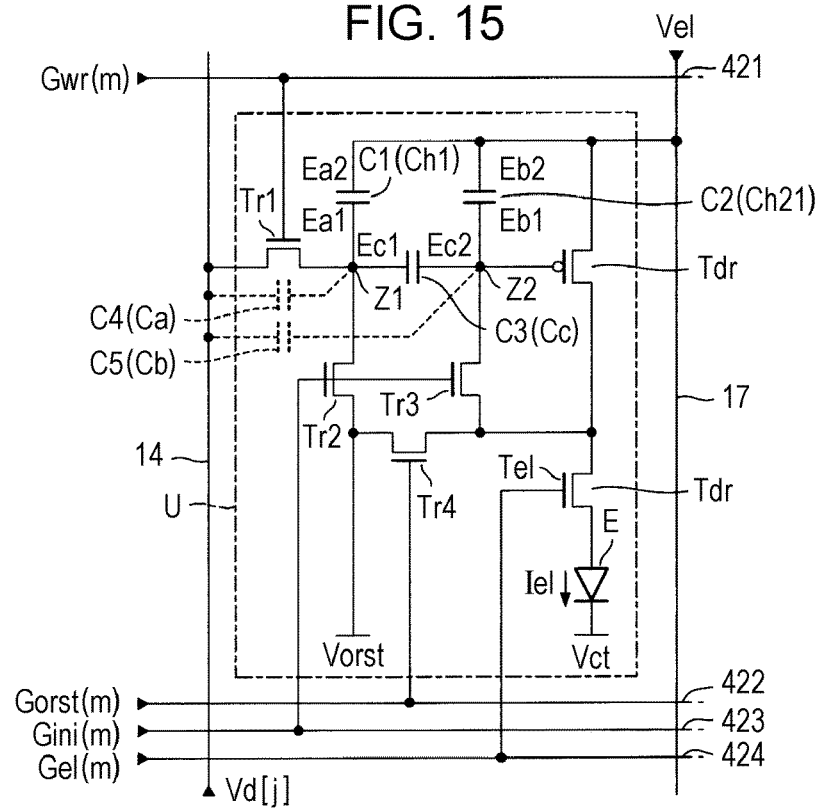
FIG. 15 illustrates an example of the structure of a pixel circuit included in an electro-optical device according to a variation of the invention.
Figure 16:
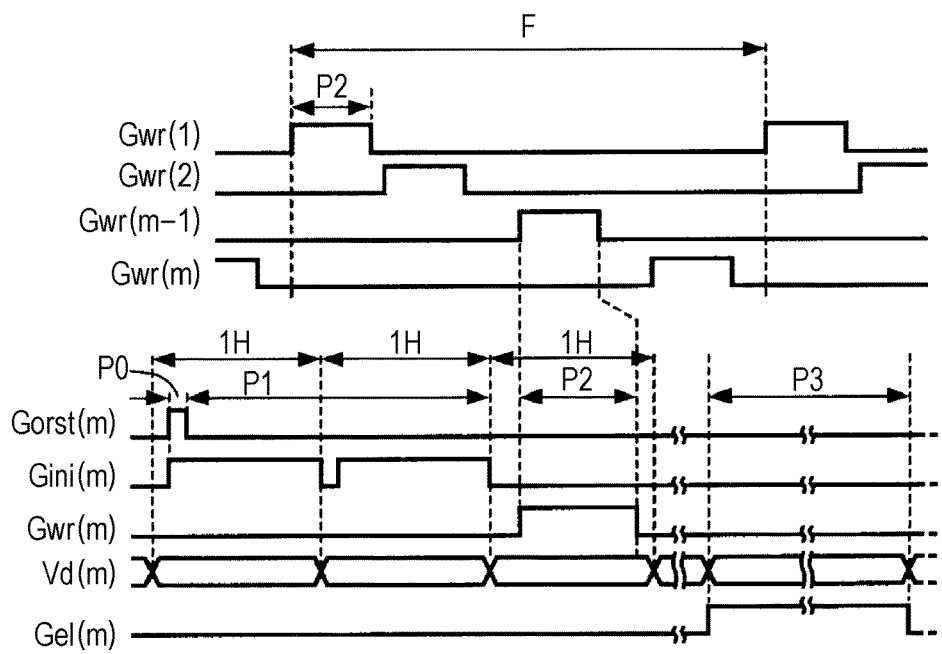
FIG. 16 illustrates operations of the electro-optical device in the variation.

The invention is not limited to the embodiments described above. For example, various variations described below are possible. Any one or any plurality of aspects of variations described below may be appropriately combined.
First Variation
The structure of the pixel circuit 110 is not limited to the above embodiments. For example, a pixel circuit U having a coupling capacitor may be used instead of the pixel circuit 110, as illustrated in FIG. 15. The pixel circuit U includes an electro-optical element E present between a power supply line 17 and a low power supply potential Vct, as illustrated in FIG. 15. The electro-optical element E is an OLED element (electro-optical element). The scanning line 12A in the above embodiments corresponds to a group of a first control line 421, a second control line 422, a third control line 423, and a fourth control line 424 in FIG. 15. The first control line 421 forming the scanning line 12A in the m-th row is given the scanning signal Gwr(m). The second control line 422 is given the control signal Gref(m). The third control line 423 is given the control signal Gini(m). The fourth control line 424 is given the control signal Gel(m). FIG. 16 is a timing diagram indicating operations of an electro-optical device in which the pixel circuit U in FIG. 15 is used to form a pixel matrix. The period P1 in FIG. 16 is the compensation period.

Second Variation

Figure 17:
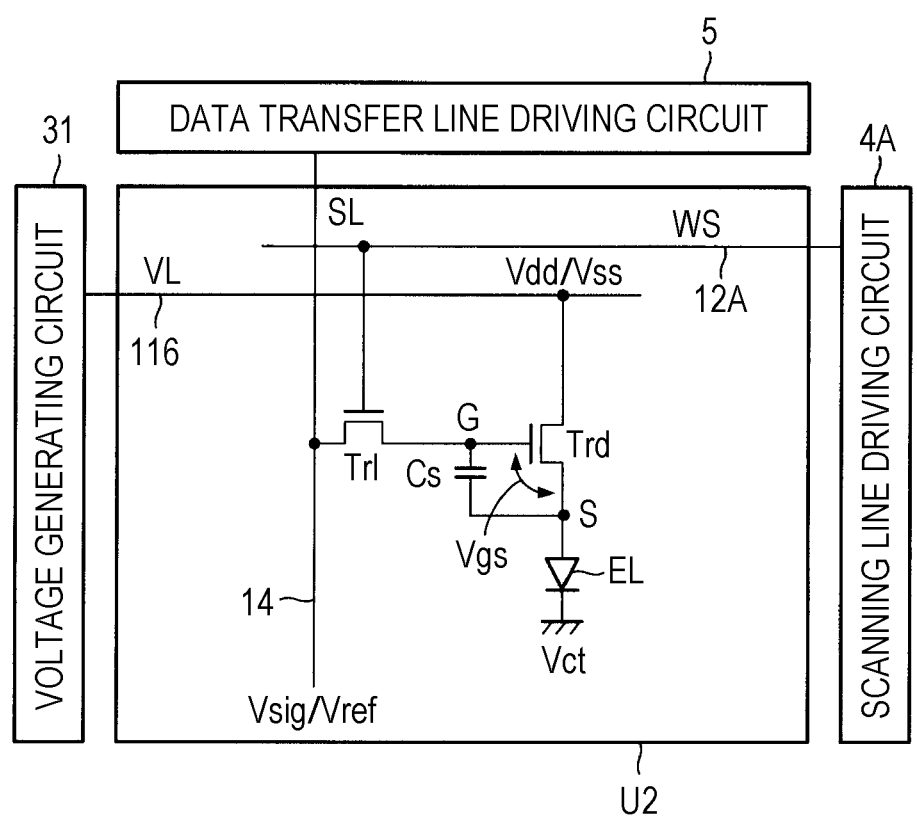
FIG. 17 illustrates an example of the structure of a pixel circuit included in an electro-optical device according to another variation of the invention.
Figure 18:
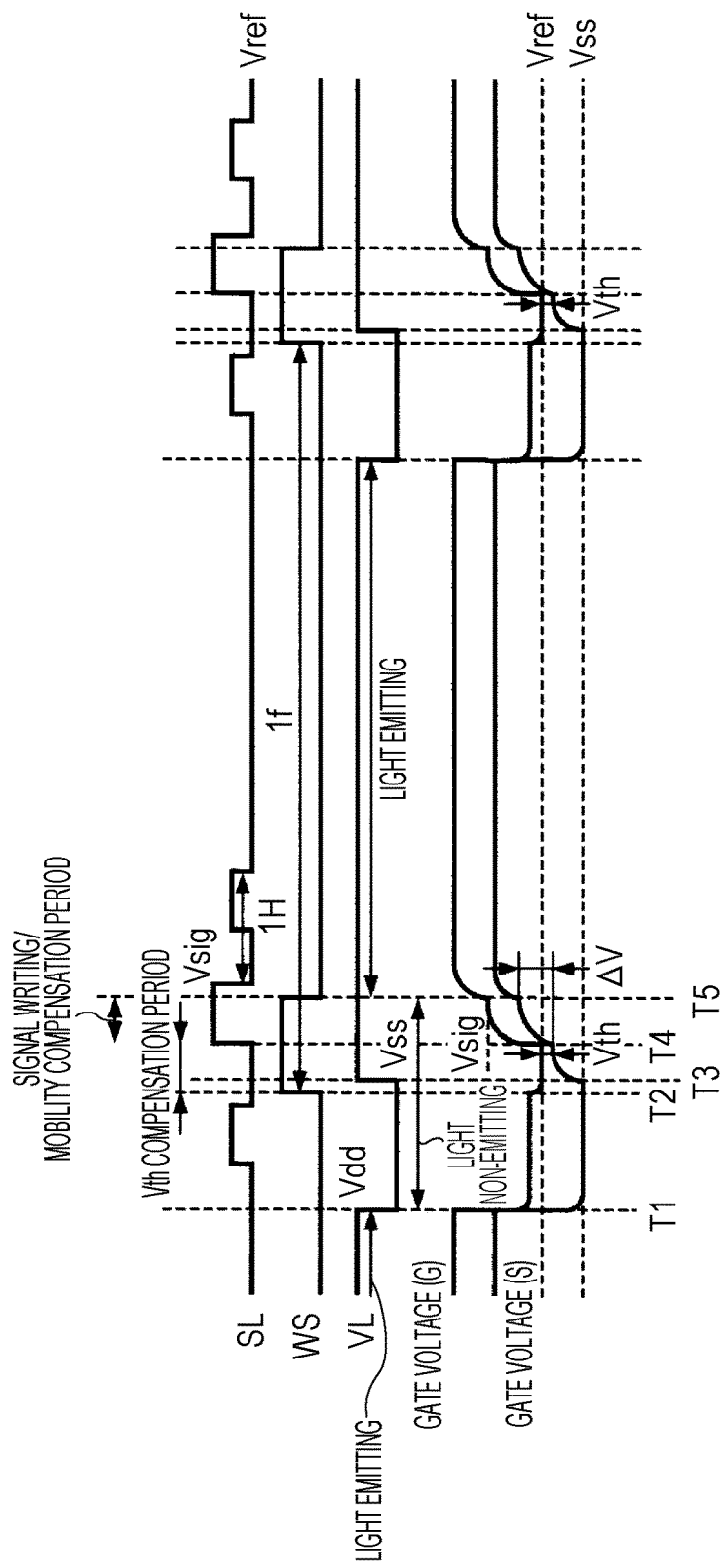
FIG. 18 illustrates operations of the electro-optical device in the other variation.

A pixel circuit U2 illustrated in FIG. 17 may be used instead of the pixel circuit 110. As illustrated in FIG. 17, the pixel circuit U2 includes an electro-optical element EL typified by an organic EL device, sampling transistor Tr1, a driving transistor Trd, and a storage capacitor Cs. The control end (gate) of the sampling transistor Tr1 is connected to a corresponding scanning line WS. One of a pair of current ends (source and drain) of the sampling transistor Tr1 is connected to a corresponding signal line SL. The other of the pair is connected to the control end (gate G) of the driving transistor Trd. One of a pair of current ends (source S and drain) of the driving transistor Trd is connected to the electro-optical element EL. The other of the pair is connected to a corresponding power supply line VL. In this variation, the driving transistor Trd is an N-channel transistor. Its drain is connected to the power supply line VL. The source S of the driving transistor Trd is connected to the anode of the electro-optical element EL as an output node. The cathode of the electro-optical element EL is connected to a predetermined cathode potential Vcath. The storage capacitor Cs is connected between the source S and gate G of the driving transistor Trd. FIG. 18 is a timing diagram indicating operations of an electro-optical device in which the pixel circuit U2 is used to form a pixel matrix. The Vth compensation period in FIG. 18 corresponds to the compensation period in the above embodiments.

Third Variation

Figure 19:
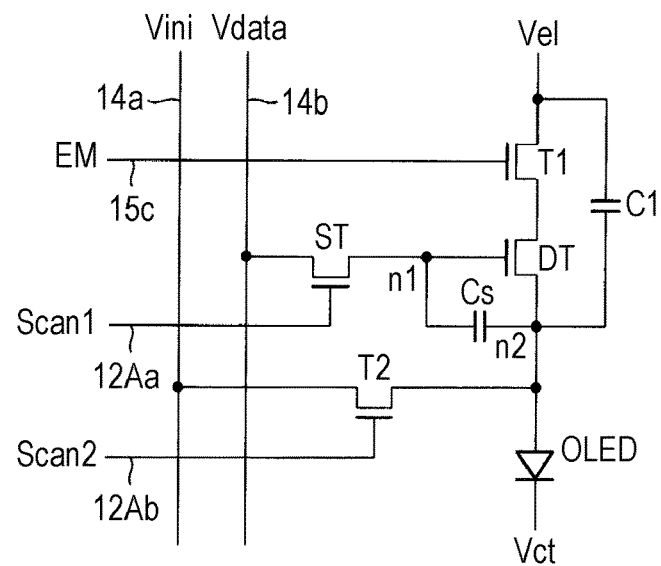
FIG. 19 illustrates an example of the structure of a pixel circuit included in an electro-optical device according to another variation of the invention.
Figure 20:
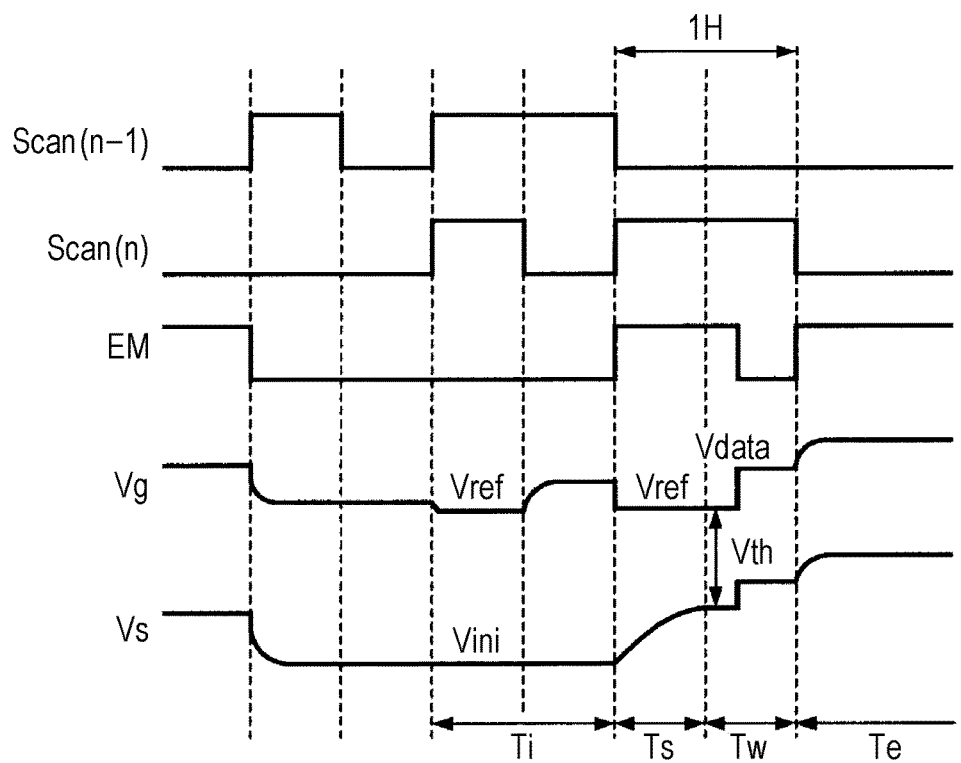
FIG. 20 illustrates operations of the electro-optical device in the other variation.

A pixel circuit having a structure illustrated in FIG. 19 may be used instead of the pixel circuit 110. FIG. 20 is a timing diagram indicating operations of an electro-optical device in which the pixel circuit illustrated in FIG. 19 is used to form a pixel matrix. The period Ts in FIG. 20 corresponds to the compensation period in the above embodiments.

Fourth Variation

The fourth transistor 124 and fifth transistor 125 in the dummy circuit 112 can be omitted. A dummy circuit that lacks the fourth transistor 124 and fifth transistor 125 has a structure described below. The dummy circuit includes the first transistor 121, second transistor 122, and third transistor 123. One of the source and drain of the second transistor 122 is connected to the data transfer line 14. The other of the source and drain is connected to the gain of the first transistor 121. One of the source and drain of the third transistor 123 is connected to the data transfer line 14. The other of the source and drain is connected to the source of the first transistor 121. Even in this structure, the pixel circuit and dummy circuit are equivalent to each other in a compensation operation. In this case, when the driving circuit including the scanning line driving circuit 4A and dummy scanning line driving circuit 4B causes the pixel circuit to perform a compensation operation in the display period and when the driving circuit causes the dummy circuit to perform a compensation operation in the blanking period, the driving circuit performs control so that the second transistor 122 and third transistor 123 in the pixel circuit and dummy circuit are turned on.

Application Examples

Next, electronic apparatuses to which the electro-optical device 1 according to embodiments and like and to application examples is applied will be described. The electro-optical device 1 is suitable to applications in which highly precise display with small-sized pixels are required. In view of this, an example in which a head-mounted display is used as an electronic apparatus will be described below.

Figure 21:
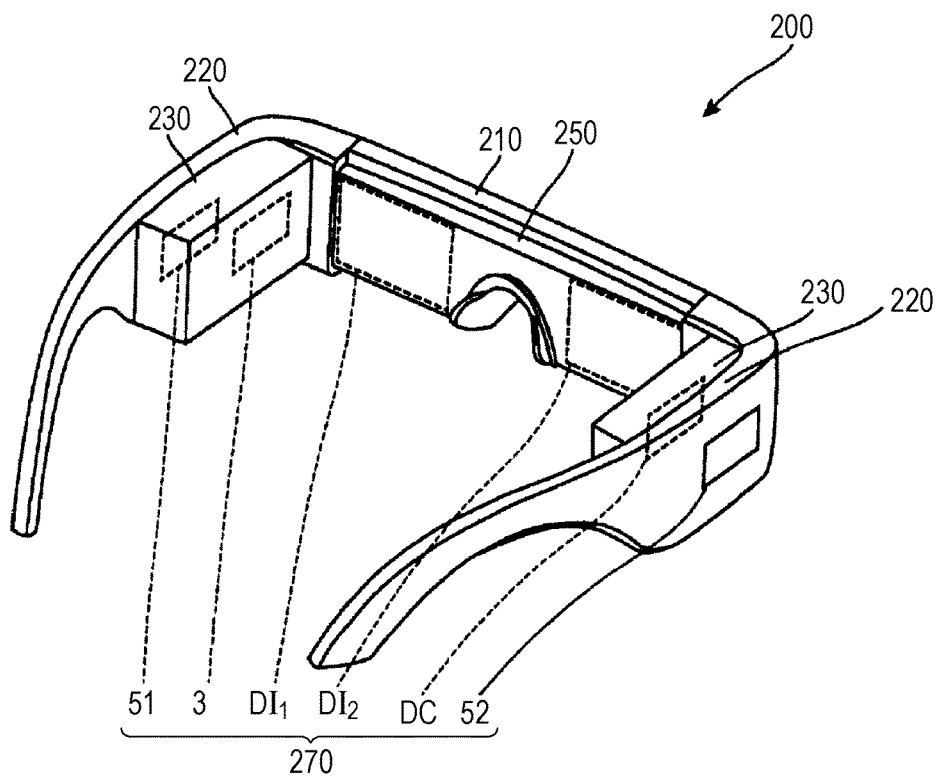
FIG. 21 illustrates the outside shape of an HMD.

FIG. 21 schematically illustrates a state in which an electro-optical device according to the invention is applied to a head-mounted display. As illustrated in FIG. 21, a head-mounted display 200 in this aspect includes a front frame 210 positioned at the front of the head of the user, a pair of side frames 220 that are connected to both ends of the front frame 210 and are positioned at both sides of the head, an optical panel 250 that is fixed to the front frame 210 so as to cover a portion ahead of the eyes, circuit covers 230, each of which is fixed to one side frame 220, and an electro-optical device 270.

The electro-optical device 270 includes two display panels. The electro-optical device 270 also includes a brightness balance adjustment input section 51 and an entire lightness adjustment input section 52, as the control circuit 3. The brightness balance adjustment input section 51 is attached to one of the side frames 220 so as to be operable. The entire lightness adjustment input section 52 is attached to the other of the side frames 220 so as to be operable. The brightness balance adjustment input section 51 executes horizontal synchronous duty cycle control. The entire lightness adjustment input section 52 executes vertical synchronous duty cycle control. With the head-mounted display 200, the control circuit 3 is provided in the circuit cover 230 fixed to the one of the side frames 220 and a power supply circuit DC is provided in the circuit cover 230 fixed to the other of the side frames 220. However, this layout can be appropriately changed.

A pair of display panels DI1 and DI2 are provided in the optical panel 250; the display panel DI1 is disposed at a portion ahead of the left eye and the display panel DI2 is disposed at a portion ahead of the right eye. Light exiting the display panels DI1 and DI2 exit the optical panel 250. The display panel DI1, which is one of the display panel pair, is visually recognized by the left eye of the user and the display panel DI2, which is the other of the display panel pair, is visually recognized by the right eye of the user.

The general demand placed on a head-mounted display is to change the lightness of an image visually recognized by the user. In response to this demand, with the head-mounted display 200, the lightness of an image can be changed by changing the entire lightness of the electro-optical device 270 with the entire lightness adjustment input section 52. When the display panel DI1, which is one of the display panel pair, is visually recognized by one eye of a person and the display panel DI2, which is the other of the display panel pair, is visually recognized by the other eye of the person, if the display panels DI1 and DI2 have different brightness, the user tends to feel uncomfortable. Therefore, there is a demand to adjust the brightness of the display panels DI1 and DI2 on the left and right. In response to this demand, with the head-mounted display 200, a brightness balance between the display panels DI1 and DI2 on the left and right can be adjusted with the brightness balance adjustment input section 51. It is also possible to independently perform the above changing of the lightness of an image and the adjustment of the brightness balance between the display panels DI1 and DI2 on the left and right.

Figure 22:
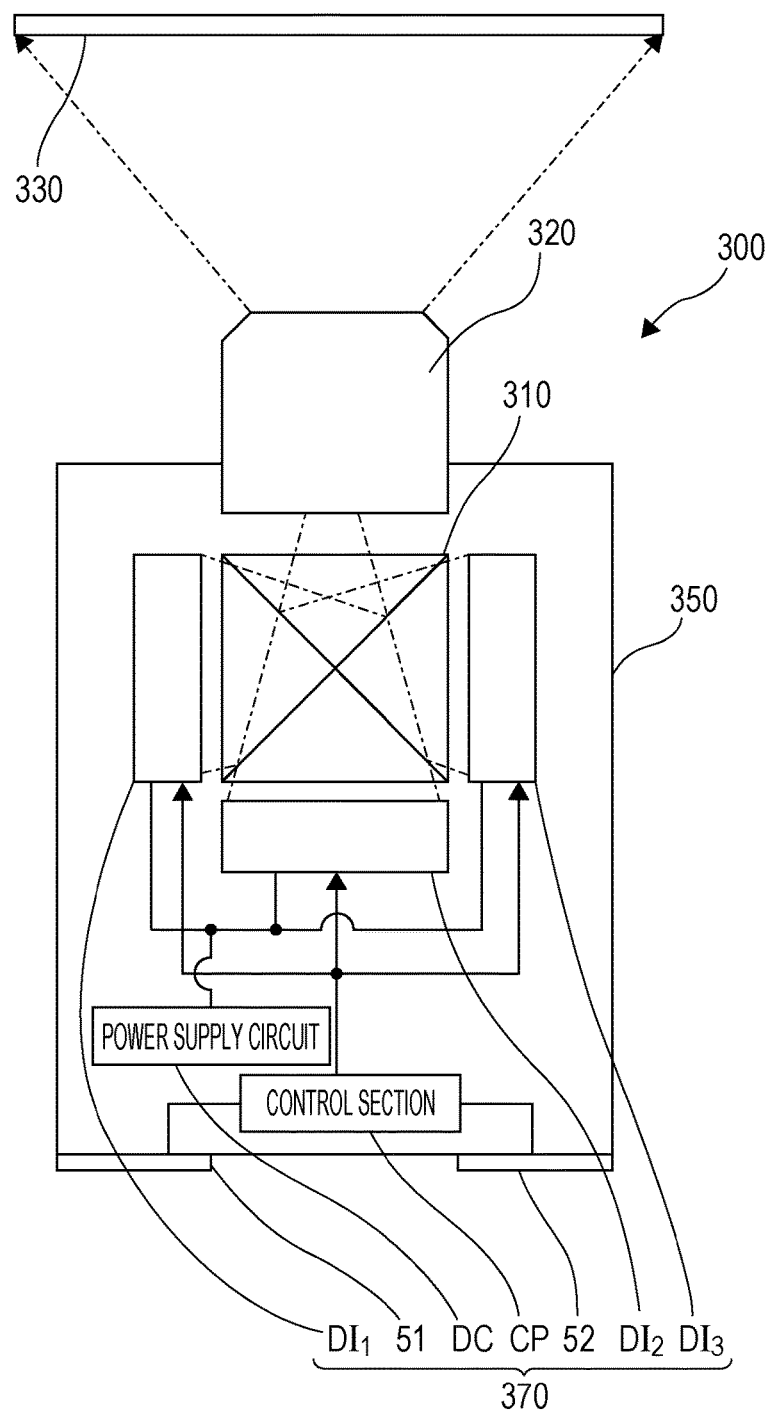
FIG. 22 is a block diagram illustrating the structure of a projector.

FIG. 22 schematically illustrates a state in which an electro-optical device according to the invention is applied to a projector. As illustrated in FIG. 22, a projector 300 includes a cabinet 350, an electro-optical device 370, a dichroic prism 310, and a projection lens 320.

The electro-optical device 370 includes three display panels. The electro-optical device 370 also includes the brightness balance adjustment input section 51 and entire lightness adjustment input section 52 as the control circuit 3.

The display panels DI1, DI2, and DI3 are disposed in the cabinet 350. The pixel array PA of each of the display panels DI1, DI2, and DI3 has monochrome pixels P. In this aspect, the display panel DI1 displays an image in red, the display panel DI2 displays an image in green, and the display panel DI3 displays an image in blue. The display panels DI1, DI2, and DI3 are disposed so that directions in which light exit mutually adjacent display sections form an angle of about 90 degrees. Specifically, the display panels DI1, DI2, and DI3 are disposed so that the display panel DI1 and display panel DI2 are adjacent to each other, the display panel DI2 and display panel DI3 are adjacent to each other, and the display panel DI1 and display panel DI3 face each other.

The dichroic prism 310 is disposed at a position enclosed by the display panels DI1, DI2, and DI3. The display panels DI1, DI2, and DI3 each face a light incident surface, which is a side surface of the dichroic prism 310. The projection lens 320 is disposed on the same side as the light exit surface of the dichroic prism 310. It is possible to exit light from the interior of the cabinet 350 through the projection lens 320 to the outside of the cabinet 350. The projection lens 320 may be composed of a single lens or a plurality of lenses.

Outside the cabinet 350, the brightness balance adjustment input section 51 and entire lightness adjustment input section 52 are disposed so as to be operable. When the projector 300 is in use, red light exiting the display panel DI1, green light exiting the display panel DI2, and blue light exiting the display panel DI3 are mutually superimposed, projecting, to a screen 330, a color image on which a red image, a green image, and a blue image are superimposed. The projector 330 may be a light-transmitting screen or may be a light-reflecting screen.

A demand on the use of the projector 300 is to change the lightness of light exiting the projector 300 according to lightness in a room in which the projector 300 is used. In response to use this demand, with the projector 300 in this aspect, the lightness of light exiting the projector 300 can be changed by changing the entire lightness of the electro-optical device 370 with the entire lightness adjustment input section 52. Another demand placed on a projector that projects a color image as with the projector 300 in this aspect is to adjust a white balance. In response to this demand, with the projector 300 in this aspect, brightness balance among red, green, and blue can be adjusted by adjusting brightness balance among the three display panels DI1, DI2, and DI3 of the electro-optical device 370 with the brightness balance adjustment input section 51. This enables white balance to be adjusted. It is also possible to independently perform the changing of the lightness of light exiting the projector 300 and white balance adjustment.

In this aspect, the display panels DI1, DI2, and DI3 are not limited to display panels that emit only light in particular colors (in the above description, red, green, and blue); display panels that emit light in other colors may be used.

Although, in this aspect, a case in which the display panels DI1, DI2, and DI3 respectively display an image in red, an image in green, and an image in blue has been described, this is not a limitation. Instead of displaying an image, the display panels DI1, DI2, and DI3 may be a red light source, a green light source, and a blue light source, respectively. In this case, a liquid crystal panel or the like may be placed in front of the display panels DI1, DI2, and DI3, and the liquid crystal panel may display an image according to light exiting the display panels DI1, DI2, and DI3.

Besides the head-mounted display 200, the electro-optical device 1 can be applied to an electronic viewfinder used in a video camera, an interchangeable-lens digital camera, or the like and to an information display section used in a wristwatch, a projector, or a mobile information terminal such as a tablet terminal.

The entire disclosure of Japanese Patent Application No. 2017-045993, filed Mar. 10, 2017 is expressly incorporated by reference herein.

What is claimed is:

1. An electro-optical device comprising:
a pixel circuit that includes a first transistor and an electro-optical element to which a current is supplied from the first transistor, the pixel circuit being driven in a frame period composed of a display period and a blanking period;
a driving circuit that controls the pixel circuit such that the pixel circuit executes a compensation operation that compensates a property of the first transistor in the display period and such that the pixel circuit does not execute the compensation operation in the blanking period; and
a dummy circuit that consumes electric power in the blanking period such that a total power consumption in the pixel circuit and the dummy circuit in the display period and a total power consumption in the pixel circuit and the dummy circuit in the blanking period approach each other.

2. The electro-optical device according to claim 1, wherein:
the dummy circuit is equivalent to the pixel circuit in the compensation operation; and
the driving circuit controls the dummy circuit such that the dummy circuit performs an operation equivalent to the compensation operation in the blanking period.

3. The electro-optical device according to claim 2, wherein:
each of the pixel circuit and the dummy circuit includes the first transistor,
a second transistor, one of a source and a drain of the second transistor being connected to a data transfer line, another of the source and the drain of the second transistor being connected to a gate of the first transistor, and
a third transistor, one of a source and a drain of the third transistor being connected to the data transfer line, another of the source and the drain of the third transistor being connected to a drain of the first transistor; and
the driving circuit performs control such that when the driving circuit causes the pixel circuit to perform the compensation operation in the display period and when the driving circuit causes the dummy circuit to perform the compensation operation in the blanking period, the second transistor and the third transistor in the pixel circuit and the second transistor and the third transistor in the dummy circuit are turned on.

4. The electro-optical device according to claim 3, wherein:
each of the pixel circuit and the dummy circuit includes a fourth transistor, a source of the fourth transistor being connected to the drain of the first transistor, a drain of the fourth transistor being connected to the electro-optical element, and
a fifth transistor, one of a source and a drain of the fifth transistor being connected to a potential line, another of the source and the drain of the fifth transistor being connected to the drain of the fourth transistor; and a potential that turns off the fourth transistor is supplied to a gate of the fourth transistor in the dummy circuit, and a potential that turns on the fifth transistor is supplied to a gate of the fifth transistor in the dummy circuit.

5. The electro-optical device according to claim 2, wherein:
the dummy circuit includes
a sixth transistor, a drain of the sixth transistor being connected to a power supply line through which a power supply potential is supplied to the first transistor in the pixel circuit, a drain and a gate of the sixth transistor being connected together, and
a seventh transistor, one of a source and a drain of the seventh transistor being connected to a data transfer line, another of the source and the drain of the seventh transistor being connected to the gate of the sixth transistor; and
the driving circuit performs control such that the seventh transistor in the dummy circuit is turned on in the blanking period.

6. The electro-optical device according to claim 2, wherein:
the dummy circuit includes an eighth transistor, a ninth transistor, and a resistor, which are connected in series between a first power supply line that supplies a first power supply potential and a second power supply line that supplies a second power supply potential;
a gate of the eighth transistor is given a potential that turns on the eighth transistor; and
the driving circuit performs control such that the ninth transistor in the dummy circuit is turned on in the blanking period.

7. An electro-optical device comprising:
a pixel matrix section including a first pixel circuit and a second pixel circuit each of which includes a first transistor and an electro-optical element to which a current is supplied from the first transistor, and each of which is driven in a frame period composed of a display period and a blanking period; and
a driving circuit that controls the first pixel circuit such that the first pixel circuit executes a compensation operation that compensates a property of the first transistor in the display period and such that the first pixel circuit does not execute the compensation operation in the blanking period, and that controls the second pixel circuit such that the second pixel circuit executes an operation equivalent to the compensation operation such that a total power consumption in the pixel matrix section in the display period and a total power consumption in the pixel matrix section in the blanking period approach each other.

8. An electronic apparatus comprising the electro-optical device according to claim 1.

9. An electronic apparatus comprising the electro-optical device according to claim 2.

10. An electronic apparatus comprising the electro-optical device according to claim 3.

11. An electronic apparatus comprising the electro-optical device according to claim 4.

12. An electronic apparatus comprising the electro-optical device according to claim 5.

13. An electronic apparatus comprising the electro-optical device according to claim 6.

14. An electronic apparatus comprising the electro-optical device according to claim 7.

* * * * *